US012211680B2

(12) United States Patent
Ruzic et al.

(10) Patent No.: US 12,211,680 B2
(45) Date of Patent: Jan. 28, 2025

(54) PULSED POWER MODULE WITH PULSE AND ION FLUX CONTROL FOR MAGNETRON SPUTTERING

(71) Applicant: Starfire Industries LLC, Champaign, IL (US)

(72) Inventors: David N. Ruzic, Pesotum, IL (US); Robert Andrew Stubbers, Savoy, IL (US); Brian Edward Jurczyk, Champaign, IL (US)

(73) Assignee: Starfire Industries LLC, Champaign, IL (US)

( * ) Notice: Subject to any disclaimer, the term of this patent is extended or adjusted under 35 U.S.C. 154(b) by 242 days.

(21) Appl. No.: 17/375,383

(22) Filed: Jul. 14, 2021

(65) Prior Publication Data

US 2021/0343513 A1 Nov. 4, 2021

Related U.S. Application Data

(62) Division of application No. 16/006,357, filed on Jun. 12, 2018, now Pat. No. 11,069,515.

(Continued)

(51) Int. Cl.
*H01J 37/34* (2006.01)
*C23C 14/34* (2006.01)
(Continued)

(52) U.S. Cl.
CPC ...... *H01J 37/3467* (2013.01); *C23C 14/3485* (2013.01); *C23C 14/35* (2013.01);
(Continued)

(58) Field of Classification Search
CPC ............... H01J 37/3467; H01J 37/3405; H01J 37/3414; H01J 37/3444; H01J 37/3464;
(Continued)

(56) References Cited

U.S. PATENT DOCUMENTS 5,015,493 A * 5/1991 Gruen ..................... C23C 14/32
427/571
5,303,139 A * 4/1994 Mark ....................... H05H 1/46
363/63

(Continued)

FOREIGN PATENT DOCUMENTS

WO WO 2014/209497 A1 12/2014

OTHER PUBLICATIONS

Ma et al. "Effect of bias voltage on TiAlSiN nanocomposite coatings deposited HiPIMS", Applied Surface Science, 392, Jan. 2017, pp. 826-833. (Year: 2017).*

(Continued)

*Primary Examiner* — Rodney G McDonald
(74) *Attorney, Agent, or Firm* — Leydig, Voit & Mayer, Ltd.

(57) ABSTRACT

An electrical power pulse generator system and a method of the system's operation are described herein. A main energy storage capacitor supplies a negative DC power and a kick energy storage capacitor supplies a positive DC power. A main pulse power transistor is interposed between the main energy storage capacitor and an output pulse rail and includes a main power transmission control input for controlling power transmission from the main energy storage capacitor to the output pulse rail. A positive kick pulse power transistor is interposed between the kick energy storage capacitor and the output pulse rail and includes a kick power transmission control input for controlling power transmission from the kick energy storage capacitor to the output pulse rail. A positive kick pulse power transistor control line is connected to the kick power transmission control input of the positive kick pulse transistor.

10 Claims, 24 Drawing Sheets

Related U.S. Application Data

(60) Provisional application No. 62/518,362, filed on Jun. 12, 2017.

(51) Int. Cl.
  *C23C 14/35* (2006.01)
  *H03K 3/011* (2006.01)
  *H03K 3/02* (2006.01)

(52) U.S. Cl.
  CPC ...... *H01J 37/3405* (2013.01); *H01J 37/3414* (2013.01); *H01J 37/3444* (2013.01); *H03K 3/011* (2013.01); *H03K 3/02* (2013.01)

(58) Field of Classification Search
  CPC .. H01J 37/3476; C23C 14/3485; C23C 14/35; H03K 3/011; H03K 3/02
  USPC ........................................ 204/298.06, 298.08
  See application file for complete search history.

(56) References Cited

U.S. PATENT DOCUMENTS

| | | | | |
|---|---|---|---|---|
| 5,770,023 | A | * | 6/1998 | Sellers .................. C23C 14/022 204/192.12 |
| 5,810,982 | A | * | 9/1998 | Sellers .............. H01J 37/32862 204/192.12 |
| 2012/0138452 | A1 | * | 6/2012 | Anders ............... H01J 37/3497 204/298.03 |
| 2015/0184284 | A1 | | 7/2015 | Elghazzali et al. |
| 2017/0022604 | A1 | * | 1/2017 | Christie ............. C23C 14/3492 |

OTHER PUBLICATIONS

European Patent Office, Examination Report in corresponding European Patent Application No. 18818964.1 dated Nov. 16, 2022 (8 pages).

* cited by examiner

PULSED POWER MODULE WITH PULSE AND ION FLUX CONTROL FOR MAGNETRON SPUTTERING

CROSS-REFERENCE TO RELATED APPLICATION

This application is a divisional application of U.S. patent application Ser. No. 16/006,357, filed Jun. 12, 2018 (U.S. Pat. No. 11,069,515), which is a non-provisional of U.S. Provisional Application Ser. No. 62/518,362, filed on Jun. 12, 2017, entitled "PULSED POWER MODULE WITH PULSE AND ION FLUX CONTROL FOR MAGNETRON SPUTTERING," the contents of which are expressly incorporated herein by reference in their entirety, including any references therein.

TECHNICAL FIELD

The disclosure generally relates to pulsed power systems to drive plasma sputtering hardware for thin-film deposition, and more particularly to high-power impulse magnetron sputtering with the generation of directed ion flux with energy control for hybrid deposition/etching and surface treatment.

BACKGROUND OF THE INVENTION

Sputter coating is a physical vapor deposition process whereby atoms are transferred from a target source to a substrate to be coated. Ions are generated in an electric plasma discharge chamber where a voltage is applied between two electrodes causing electrons to be accelerated in one direction (toward an electrode with a positive electrical potential) and positive ions are transported in a direction opposite the electrons. Magnetic confinement using closed-drift Hall orbits through ExB drift motion may be used to provide both high ionization probability and low electron mobility to increase the ion current towards the target electrode for increased sputtering. The relatively high ionization efficiency of the process using magnetic confinement allows low power levels to be used while achieving moderate power densities at decent deposition rates without transitioning into an arc-like discharge. Power limitations of target heating and melting still apply.

High-power impulse magnetron sputtering is a pulsed corollary to DC sputtering where much higher instantaneous currents (10-1000 times DC sputtering currents) are driven above the target with a corresponding lower duty factor to keep average power nearly constant. As a result: (1) plasma densities are several orders of magnitude higher, (2) there is a transition from carrier gas dominated sputtering (i.e. Ar+) to metal vapor dominated sputtering (e.g. Cu+), and (3) a higher ionization fraction of the sputtered neutral species is present as they transit the denser magnetic confinement plasma zone.

Whereas, DC sputtering can achieve ionization fractions in the 1-3% range, conventional HIPIMS can routinely achieve ion fractions of 10-30% reaching the substrate. Sputtered neutral atoms will have a few eV of energy (degraded by background gas collisions), whereas the ions will have the sheath potential energy drop to the substrate typically 10-30 eV leaving to improved local heating and densification. HiPIMS films are denser and exhibit better adhesion properties compared to DC sputtering; however, the HiPIMS technique previously achieved lower deposition rates (20-80%) compared to DC sputtering and exhibited higher film stresses for many materials compared to DC sputtering. The lower deposition rate is attributed a "return effect" where the sputtered atoms are re-ionized in the dense plasma confinement layer and are recycled to the target for additional sputtering.

For reactive sputtering applications, previous sputtering systems have operated using AC to drive sputtering, with two sputtering guns alternated between each other to allow for the electron return current from one unit to clear surface charging on the other unit. The AC mode of operation is complex since both electrodes float relative to a grounded vacuum chamber, and only one electrode is actively sputtering at any time. The added system complexity and non-continuous use of electrodes increases the capital cost of the AC mode systems, and the counter electron current flow generates additional heat in the sputtering targets lowering throughput.

Target materials to be transferred to the substrate can be broadly categorized into the following three groups: easy to sputter metals, hard-to-sputter metals and dielectric materials—with both noble and reactive gas admixtures for each of the three groups. Each of these material groups requires different sputtering voltages, working gas pressures and pulse conditions. As a result many power supplies are unable to achieve operational conditions for all three of the above-mentioned operating modes—i.e. RF sputtering, pulsed DC, traditional DC/AC sputtering.

Furthermore, for insulating substrates such as roll-to-roll polymeric materials (e.g. PET or LDPE or nylon), using HiPIMS is extremely difficult because the instantaneous high-current pulse overwhelms the traditional RF substrate bias that can be maintained in conventional DC sputtering.

SUMMARY OF THE INVENTION

An electrical power pulse generator system is described herein. The system includes a main energy storage capacitor configured to supply a negative DC power and a kick energy storage capacitor configured to supply a positive DC power. The system further comprises an output pulse rail.

The system comprises a main pulse power transistor interposed between the main energy storage capacitor and the output pulse rail, wherein the main pulse power transistor includes a main power transmission control input for controlling power transmission from the main energy storage capacitor to the output pulse rail, through the main pulse power transistor. The system also includes a main pulse power transistor control line connected to the main power transmission control input of the main pulse power transistor.

The system also includes a positive kick pulse power transistor interposed between the kick energy storage capacitor and the output pulse rail, wherein the positive kick pulse power transistor includes a kick power transmission control input for controlling power transmission from the kick energy storage capacitor to the output pulse rail, through the positive kick pulse power transistor. The system further includes a positive kick pulse power transistor control line connected to the kick power transmission control input of the positive kick pulse transistor.

A method is also described herein for generating and controlling ion flux in dc high-power impulse magnetron sputtering. The method comprises providing a vacuum apparatus containing a sputtering magnetron target electrode. The method also includes generating a high-power pulsed plasma magnetron discharge with a high-current negative direct current (DC) pulse to said magnetron target electrode.

The method includes generating, using a capacitive stored power source and a positive kick pulse power transistor, a configurable sustained positive voltage kick pulse to the magnetron target electrode after terminating the negative DC pulse. During the generating, program processor configured logic circuitry issues a control signal to the positive kick pulse power transistor to control a kick pulse property of the sustained positive voltage kick pulse taken from the group consisting of: onset delay, amplitude and duration.

Additional features and advantages of the invention will be made apparent from the following detailed description of illustrative examples that proceeds with reference to the accompanying figures.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE DRAWINGS

Figure 1:
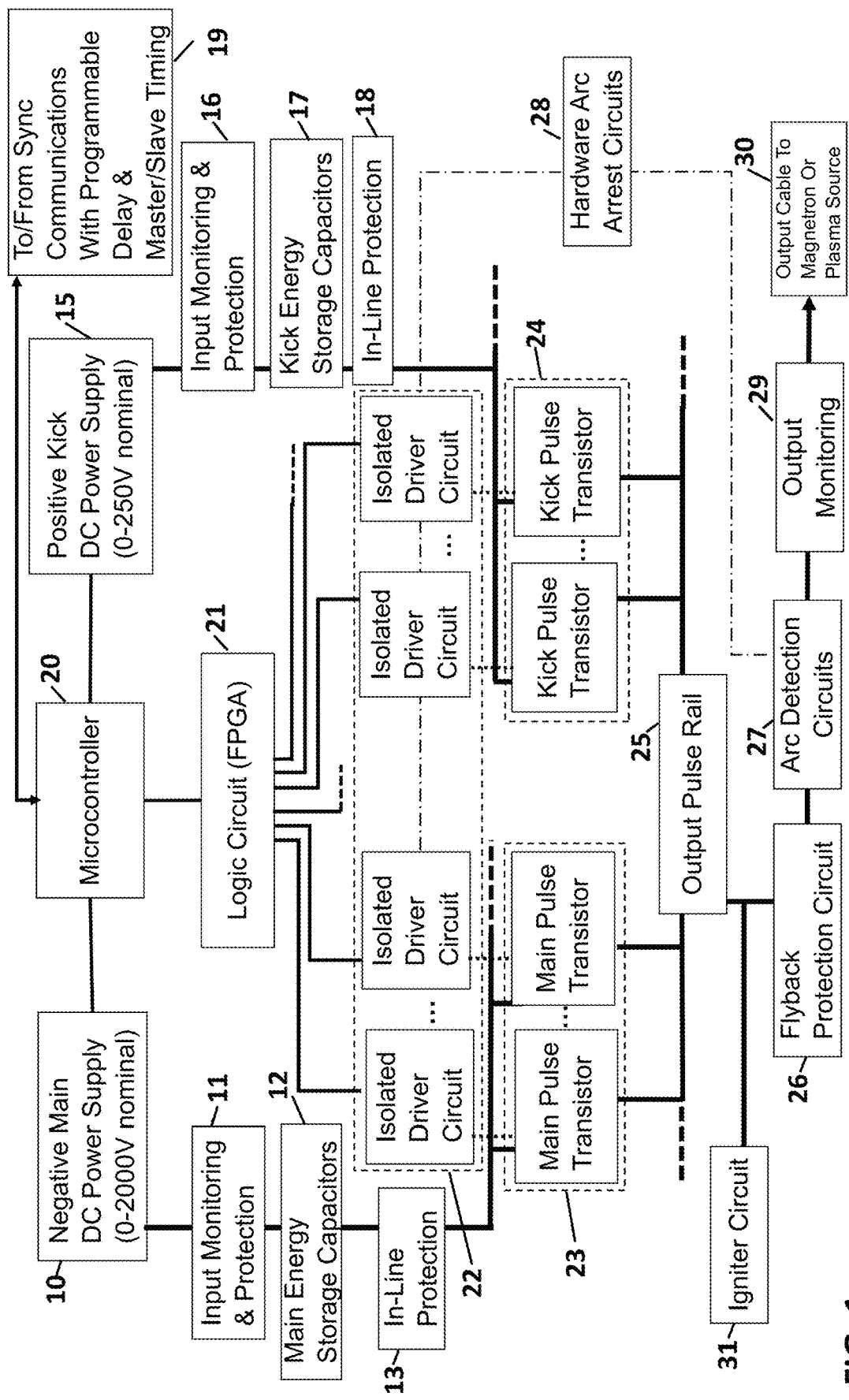
FIG. 1 schematically depicts an illustrative overall circuit architecture with configurable logic for sequential and synchronous output of main negative pulse and positive kick pulse with master/slave sync, timing delay and pulse adjustment.

The description that follows, including a detailed of the figures, is not to be taken in a limiting sense but is made merely for the purpose of describing the principles of the described embodiments.

A system is described, by way of example, for generating HiPIMS pulses for a magnetron plasma sputtering system with a high degree of pulsing flexibility for trading off pulse frequency, pulse current and pulse duration for three broad categories of target materials that consists of: easy-to-sputter metals, hard-to-sputter metals and dielectric materials with noble and reactive gases. A combination of a high-voltage pulsing circuit architecture using an array of parallel-connected, high-current, fast switches (e.g. IGBTs or MOSFETs)—each of which is driven by a corresponding dedicated/isolated driver circuit—and a programmable logic array (e.g. hardwired or FPGA) facilitates: (1) a sequential switch firing to achieve configurable high pulse frequencies (e.g. 4 kHz) at moderate peak currents (e.g. 100 A); and (2) a parallel switch firing at higher peak currents (e.g. 200 A) at lower frequencies (e.g. 2 kHz). The illustrative baseline system is nominally operating at 2 kW time-average power, which is suitable for small-to-medium sized magnetron sputter guns (e.g. <6" or small rectangular cathodes). The illustrative power supply switching architecture is scalable for larger power systems for achieving higher power throughput, e.g. 20 kHz/20 kW throughput. Thus, for very difficult to sputter materials with low peak current the repetition rate may be increased to enhance a total deposition rate (power throughput) for a single pulsed power module. In-line monitoring of the current-electrical potential (I-V) waveform facilitates a dynamic control of a pulse repetition rate to maintain constant average power on the target for maximum power utilization as sputtering conditions change over time. The illustrative pulsing circuit incorporates protections for flyback, voltage reflection, impedance mismatch and handling strike pulses from a DC power supply during sputtering operations.

Furthermore, the illustrative system incorporates an adjustable positive kick pulse, which may be applied after a main negative pulse, to reverse a potential structure across a magnetic confinement zone and accelerate ions away from a target towards a substrate. In a HiPIMS discharge pulse, instantaneous power can reach MW-class (e.g. 1 kV*1 kA) and exceed 1 A/cm2 current density in the magnetic confinement zone. As a result, local plasma density may exceed 1e14 #/cm3 (3 mTorr equivalent), and a significant fraction of the total number of atoms removed from the target may be ionized and entrained in the plasma. The positive kick pulse reverses the potential across the zone and pulls electrons back into the target electrode. This, in turn, elevates a potential positively with a voltage drop across the dense plasma zone and this causes ions to be directed away from the target. This has an effect of increasing the deposition rate of the sputtered material on the substrate, thereby increasing a total number of ions reaching the substrate, and adding bias energy to the ions without requiring any additional hardware at the substrate for biasing. This operational behavior is favored for treating substrates consisting of dielectrics, low-temperature materials, or for applications where electrical connections are difficult (e.g. web or roll-to-roll coatings).

The above-described effect facilitates controlling an ion energy distribution function by changing a height, duration and onset relative of the kick pulse to the substrate. Because a magnetic trap impedes flow of electrons towards a target electrode, a potential structure will form that is time dependent in relation to a duration of a positive kick pulse. The local plasma potential in a vicinity of the substrate will start out negative or near zero during a main HiPIMS negative pulse. However, once the positive kick pulse is applied, electrons are drawn out of the system, and the plasma potential will elevate positive and commute to the surface of the substrate (that may be floating, grounded or actively biased). The positive kick pulse accelerates ions away from the magnetic trap, with the remainder of the positive kick pulse magnitude that exists occurring across a B-Field region. The potential structure evolves over the positive kick pulse time until the target potential is commuted across the gap raising the local potential up to near (or above) the positive kick pulse potential. Thus, the magnitude and duration of a positive kick pulse may be adjusted to provide metal ion acceleration from the dense plasma region with energies of >50 eV while minimally influencing a plasma potential near the substrate; this may be used to minimize an effect of implanted argon ions and favor the implantation of metal ions.

For example, a positive kick pulse (also referred to generally as "positive kick") of +100V applied over a short duration (e.g. 10-25 usec) causes a quasi-steady potential to appear across the magnetic confinement plasma region and accelerate ions towards the substrate (and anode), with the ions gaining a fraction of the energy (e.g. 50-80V) before the positive kick pulse terminates. The exact ion energy distribution is determined by the positive kick pulse amplitude, duration, plasma density, sputtered material type, magnetic field strength, magnetic field shape, level of target erosion, and other process variables of the positive kick pulse. Thus, the positive kick pulse increases the ion fraction arriving at the substrate. For very short positive kick pulses (e.g. less than a 50 usec negative pulse duration), the effect on the ion fraction delivered to the substrate may be large, with the percentage of ions reaching the substrate approaching 90%. The positive kick pulse also increases the deposition rate relative to conventional HiPIMS sputtering since, in the case of the positive kick pulse, the sputtered atoms that are ionized in the dense plasma are not recycled back to the target, and are instead directed towards the substrate. The above-discussed effects arising from incorporating a positive kick pulse address what has been generally considered a fundamental limitation in HiPIMS for commercial adoption.

The positive kick pulse gives the user the ability to tune operation of the system to control film stress arising from rapid energy deposition and ion densification allowing films to achieve Zone T on the Thornton diagram with a transition from tensile to compressive stress with stress annealing properties of pulsed thermal annealing from the increased ion energy deposition at the thin-film. The additional ion energy may be used to improve interface mixing and adhesion for the HiPIMS layer bonding.

A configured/adjustable magnitude of the positive kick pulse is specified to meet a particular function of the sputtering operation. A value of 250V, or less, may be used to avoid etching a substrate (which is the case for most applications). However, a high positive kick pulse magnitude may be used to initially perform a cleaning or etching function during a preliminary step on the substrate to clear the substrate surface of contaminants and debris that may degrade film adhesion. The initial high voltage cleaning/etching operation eliminates a need for a separate ion gun for independent substrate target surface cleaning. The etching step may be combined with sputtering for ion implantation, intermixing and improving adhesion-bonding of dissimilar materials for graded interfaces. As an example, the initial positive kick pulse amplitude of +250V for etch cleaning could be used at low HiPIMS current densities <0.1 A/cm2, then operated with high HiPIMS current densities >1 A/cm2 to intermix target material sputtering and implantation for a good interface joint, before adjusting the positive kick pulse to a limited etching value (e.g. +100V) for the remainder of the deposition operation. Using the configurable/adjustable feature of the control circuit for generating the positive kick pulse, the ion energy distribution may be adjusted to be above a first sputtering threshold for a "material A" (e.g. CxHy) but less than a second sputtering threshold for a "material B" (e.g. 304 SS).

Another aspect of the described illustrative operation of the exemplary system is that the positive kick pulse provides a return electron current that neutralizes surface charging on target electrodes. The aspect is especially advantageous for reactive gas environments. Neutralizing surface charging minimizes arcing and obviates a need for running two magnetron sputtering guns in AC mode since a single system can achieve neutralization, thereby lowering capital and operating cost. Since some of the ion energy will be directed towards the anode electrode, the positive kick pulse mitigates the disappearing anode effect by keeping the surface clear for electrical commutation. This is advantageous for reactive sputtering applications where HiPIMS advantageously provides the ability to run at higher power densities without poisoning the target. "Poisoning", as used herein, refers to an undesirable potential effect when a target material (e.g. aluminum metal) surface undergoes a chemical reaction with a reactive gas species (e.g. oxygen) to change the sputtering properties of the target. In one example, oxygen may react with a surface of the target metal to form a metal oxide (e.g. Al2O3), which is referred in the art as "poisoning" the target. The metal layer, in the process of converting to a metal oxide layer, releases secondary electrons and becomes a semi-insulating layer and is prone to arcing, charge buildup, cratering and nodule formation.

Another aspect of the described system is the ability to perform hybrid deposition and etching utilizing the dense localized plasma generation regions for plasma chemistry (e.g. chemical vapor deposition and etching products) in addition to the sputtered target material for integrated CVD/PVD/Etch reactors. The dense plasma provided by HiPIMS can yield high ionization fractions and the positive kick pulse may be used to provide tunable/configurable levels of ion energy towards the target/substrate to deliver deposition materials and etching products into small and/or deep features—potentially extending Bosch-type processes, selective etching and passivation/protection for complex feature processing.

Configurable/tunable/adjustable parameters for the positive kick pulse include: pulse intensity, pulse length, pulse height, kick bias, kick pulse duration and chamber process conditions and material selections gives additional control.

A system is thus described, by way of example herein, for applying and modulating high-voltage voltage pulses for high-power impulse magnetron sputtering (HiPIMS). The system is designed to switch negative voltage from an external (or internal) DC power supply that charges an internal energy storage capacitor to generate negative voltage pulses to drive a plasma discharge for sputtering. An array of switching transistors (e.g. IGBTs or MOSFETs) arranged in a parallel electrical circuit are fired sequentially or simultaneously to achieve a range of repetition rate and peak current capability with flyback protection and arc suppression. In-line current and voltage monitoring allows real-time power calculation to adjust repetition rate for achieving constant target power. Synchronization signals allow synchronization between units for flexibility in timing deposition rate of sputtered material and external biasing. An additional positive voltage power supply is integrated with power switching electronics to allow application of a positive (kick) voltage after the termination of the main negative pulse to "kick" ions entrained in the dense plasma, high B-field near the magnetron sputter target and direct many of these ions towards the substrate to be coated. Adjusting a magnitude of the positive voltage "kick" pulse, duration of the kick pulse and onset delay of the kick pulse affect an ion energy distribution reaching the substrate to be coated, thereby allowing the end-user to adjust a variety of characteristics of a treated substrate/target surface including: film stress, film density, crystallinity, morphology and electronic properties. Applying the positive kick pulse increases deposition rate, ionization fraction and ion energy reaching the substrate regardless of substrate material. As such the controlled application of the positive kick pulse during sputtering is well suited for treating dielectric substrate or temperature sensitive materials. Applying the positive kick pulse, in a controlled manner, has the added potential effect of enabling clearing charge on the target surface to decrease arcing, countering the disappearing anode effect at the anode electrode, and allowing more stable operation with reactive gases to increase the process window. The positive kick pulse may be used to sputter clean and etch surfaces for substrate pre-cleaning, to grade material interfaces for improved adhesion, grain alignment and mismatch (thermal, electrical, physical), and for preferential orientation or grain growth. Furthermore, the dense, highly ionized plasma generated with the HiPIMS pulse with user-adjustable kick pulse bias enables hybrid deposition-etching modes for selective "Bosch-like" processing for complex features requiring directed ion flux, e.g. patterned wafer etching.

An illustrative example is a system for generating high-voltage pulses using a controlled electronic circuit architecture based on an array of parallel-arranged high-current, fast power switches (e.g. IGBTs and MOSFETs) controlled by programmable logic (e.g. hardwired or FPGA) allowing: (1) sequential/serial switch firing to achieve high pulse frequencies at moderate peak currents, and (2) simultaneous/parallel switch firing for achieving higher peak currents at lower frequencies to generate a plasma for material sputtering and etching. A configurable/tunable impulse generator, including in-line sensor feedback (e.g. The IMPULSE™ system provided by Starfire Industries LLC) is illustratively depicted in FIG. 1. The illustratively depicted set of schematic elements shows an overall circuit architecture with configurable logic for sequential and synchronous output of main negative pulse and positive kick pulse with master/slave synchronization, timing delay and pulse adjustment. A negative main DC power supply 10, e.g. 1000 VDC/4 A, is connected to a series of main energy storage capacitors (capacitors 12) to provide energy to a bank of main pulse transistors (main pulse transistors 23). An input voltage and a time-averaged current feed (power) is measured through an input monitoring and protection circuit 11 that also shields the system electronics from transients on the input stage. Main in-line protection element(s) 13 provide soft dump capability and energy storage bleed down for CE and SEMI compliance. The main pulse transistors 23, typically high-voltage fast IGBTs, with voltage ratings greater than 2000V, are driven by a set of high voltage (HV) isolated driver circuits 22. A logic circuit 21, for example an FPGA or hardware logic setup, is signally connected to each one of the set of isolated driver circuits 22. The logic circuit 21 operation is controlled by commands issued by a microcontroller (processor) 20. The microcontroller 20 communicates with additional controllers/processors and external control elements through a synchronization (sync) communications line 19, e.g. EtherCAT, ModBUS, RS485, USB, etc.

A positive kick pulse DC power supply 15 similarly (to the negative main DC power supply 10) provides energy to a set of kick energy storage capacitors 17, with an input monitoring and protection 16 and an in-line protection 18, before feeding power to a set of kick pulse transistors 24 that are driven by additional dedicated ones (on a one-to-one basis with corresponding ones of the transistors) of the set of isolated driver circuits 22. The outputs of the main pulse transistors 23 and the kick pulse transistors 24 are connected to a common output pulse rail 25 configured with suitable impedance for achieving an appropriate signal response that includes facilitating both transmitting high pulse currents and dissipating/filtering high frequency noise.

A flyback protection circuit 26, which is also coupled to the common output pulse rail 25, protects the main pulse transistors 23 and the kick pulse transistors 24 from both dead short events and highly inductive loads. An arc detection circuit 27 includes components that monitor: dI/dt (current change rate), peak current, and dV/dt (voltage change rate) events. The arc detection circuit 27 is coupled with a fast-response hardware arc arrest circuit 28 that is coupled to hardware logic to disable or deactivate the set of isolated driver circuits 22. The electrical pulse delivered to an output cabling 30 is monitored through an output monitoring circuit 29 for feedback and control processing by the microcontroller 20, and adjustment of the above-described attached and synchronized units is facilitated via the synch communications line 19. Thus, in summary of the above, the pulse signal generating circuitry discussed herein with reference to FIG. 1 incorporates a series of protections for: voltage reflection, impedance mismatch, and handling strike pulses from dc sputtering power supplies.

With continued reference to FIG. 1, an igniter circuit 31 may be included to provide electrical power/current to the common output pulse rail 25 to assist with initial plasma ignition for difficult configurations such as small-diameter magnetrons, poor magnetic configurations and low secondary electron emission targets, etc.

The system depicted in FIG. 1 departs from traditional pulsed power supplies using saturable-core, pulse compression circuitry to apply high current, high-voltage pulses for sputtering. Conventional energy sources are limited in pulse frequency due to a reset time of saturable core material, and switching speed is slow due to residual output inductance resisting a change in current. The system depicted in FIG. 1 exhibits very low output inductance owing to the parallel circuit switching architecture and capacitive energy source storage. The low output inductance enables fast turn off at high currents, controlled voltage reversal, and application of an opposite polarity (e.g. positive electrical potential) kick pulse after application of a main (e.g. negative electrical potential) pulse.

The system depicted in FIG. 1 is a scalable system architecture that may be operated (via the set of isolated driver circuits 22 driving operation of corresponding ones of the power transistors on a one-to-one basis) at high switching speeds through sequential (serial) firing of the main pulse transistors 23 and kick pulse transistors 24 or, alternatively/additionally, operated at a high pulse current through simultaneously switching (on/off) the parallel-arranged power supplies/switches to supply current, with load balancing, to the common output pulse rail 25. As a result, a baseline 2 kW time-average power suitable for small-to-medium sized magnetron sputtering guns (e.g. <4" or small rectangular cathodes) operating between 2 kHz and 200 A peak current may be used for process recipe development— and then scaled to 20 kW time-average high-power systems operating in parallel at up to 20 kHz and up to 2000 A peak current with multiple series-parallel combinations in between for current (power) optimization.

The described exemplary system pertains to generating HiPIMS pulses for a magnetron plasma thin-film sputtering system (connected via the cabling 30 but not shown in FIG. 1) with a high degree of pulsing flexibility that permits tuning/configuration of the power supply circuitry that facilitates trading pulse frequency, pulse current and pulse duration for each of three broad categories of target materials: easy-to-sputter metals, hard-to-sputter metals and dielectric materials with noble and reactive gases. The architecture of the system schematically depicted in FIG. 1 not only supports the voltage reversal feature used in AC reactive sputtering—namely the charge neutralization on the sputtering target to minimize arcing and nodule formation—, but also elevates the functionality of this feature to a new level by supporting a configurability/tenability and live feed-back based control that allows direct operation of a connected/driven system with reactive gases. In HiPIMS peak current densities on a magnetron sputter gun may exceed 1 A/cm2 leading to very high ionization fractions in a controlled volume, e.g. exceeding densities of 1e14 1/cm3. The positive kick pulse power supply 15 delivers a fixed potential through energy storage capacitors 17 and delivered to the plasma through kick pulse transistors 24. The pulsed power handling capability enables generating high currents and rapidly modifying a plasma potential near the magnetron sputtering gun (or plasma generator).

Figure 2A:
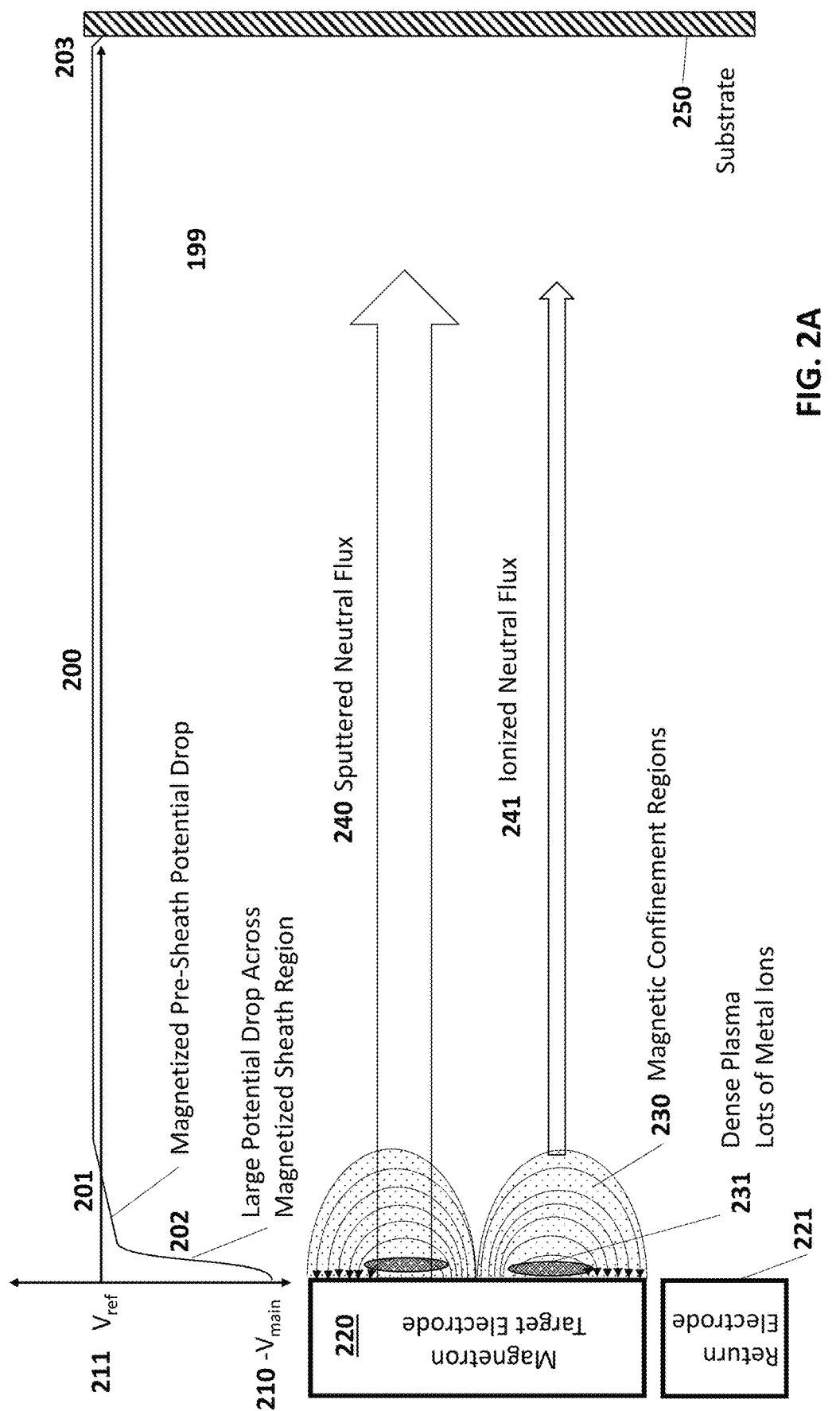
FIG. 2A illustratively depicts a plasma potential profile between a target electrode and a substrate during application of a main negative voltage pulse to the target and an example affected ion and neutral species.

By way of example, the user-adjustable positive kick pulse DC voltage 15 generates/issues a positive kick pulse to the magnetron plasma discharge (after the fast termination of a main negative pulse 210) to reverse the potential structure across the magnetic confinement zone and accelerate ions away from the target towards the substrate. FIG. 2A illustratively depicts a plasma potential profile 199 between a magnetron target electrode 220 and a substrate 250 during application of the main negative pulse 210 (cathode bias) to the target and an example affected ion and neutral species. The plasma potential profile 199 is separated into several parts, namely a magnetized pre-sheath 201 where voltage begins to drop towards a main negative sheath 202 from a bulk plasma region 200 leading up to an anode sheath 203 at the substrate. These potentials are typically referenced to a chamber ground 211 and the current return path to the DC power supply 10 is through a magnetron return electrode 221.

With continued reference to FIG. 2A, during application of the main negative pulse, most of the voltage drop occurs across the main negative sheath 202 and is located very close to the target electrode 220 surface. A dense HiPIMS plasma zone 231 is located immediately adjacent to the main negative sheath 202 where significant sputtered material from the target electrode 220 is ionized and returned to the target surface for re-sputtering. There is a larger volume magnetic confinement region 230 that expends outwards from the target electrode and is shaped by the magnetic field lines from the magnetron magnet pack supporting the magnetron target electrode 220. The intense plasma discharge from the high pulse current leads to a high degree of ionization of a sputtered neutral flux 240 that is converted into an ionized neutral flux 241. During the HiPIMS pulse, the instantaneous power can exceed 200 kW (e.g. 1000V*200 A) and the power concentrated in a small plasma wetted area of a few cm2 in the magnetron racetrack over the target electrode 220. Such high power over a small volume leads to very intense ionization and rarefaction of the carrier gas with plasma densities approaching 1E14/cm3 and a significant fraction of the total number of atoms removed from the target may be ionized and be entrained in the plasma. However, during HiPIMS, a significant fraction of the ionized neutral flux created in the dense HiPIMS plasma zone 231 may be recycled to the target electrode 220—leading to lower deposition rates compared to DC sputtering. The magnetized pre-sheath potential drop 201 makes it difficult for only the highest energy ions to escape the main negative sheath 202. The overall increase in ionization in the extended magnetic confinement region 230 accounts for a large fraction of the ionized neutral flux 241 reaching the substrate 250.

The above-described negative effect is overcome, in accordance with the illustrative examples, by applying a positive kick pulse 212.

Figure 2B:
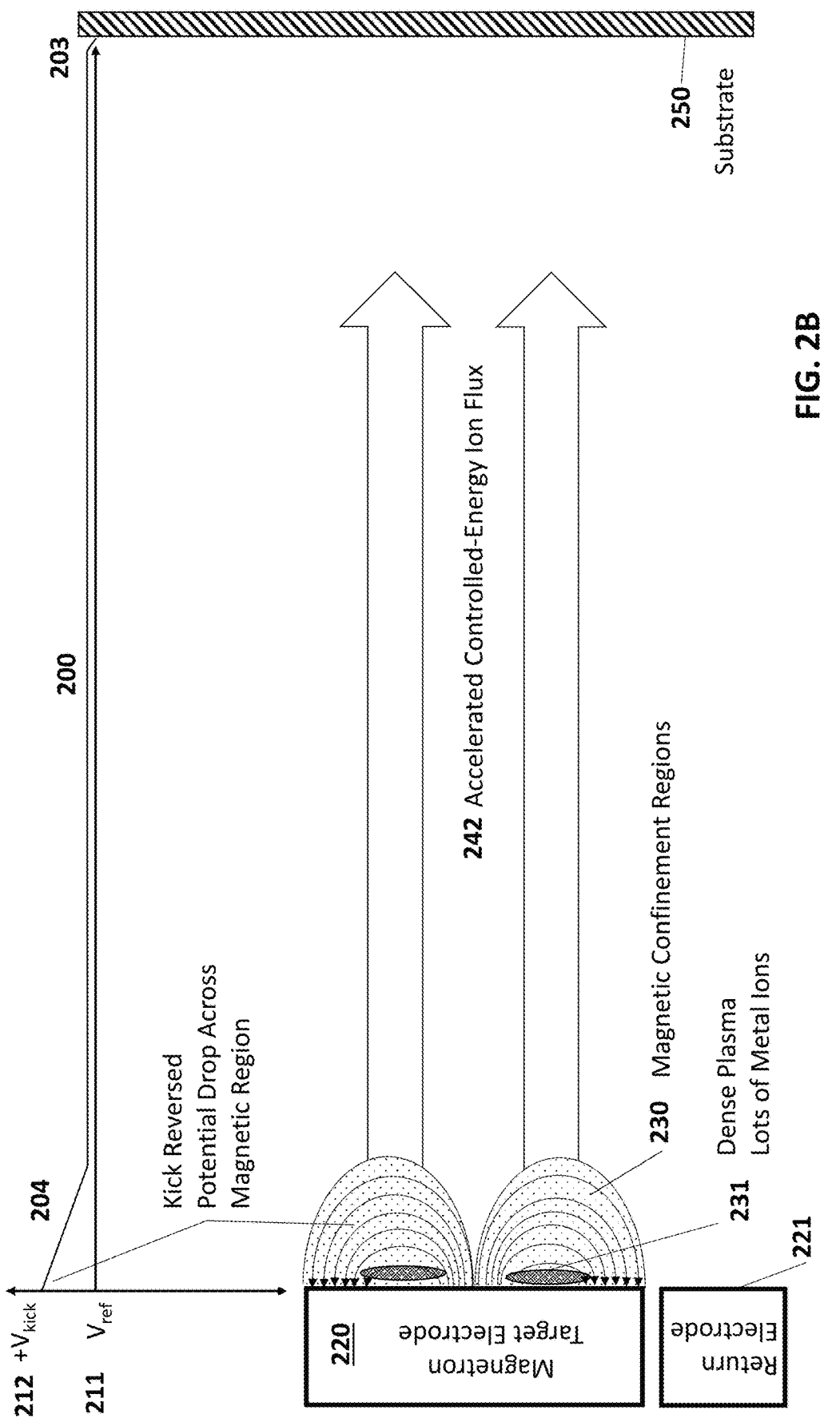
FIG. 2B illustratively depicts a plasma potential profile between a target electrode and a substrate during initial application of a positive kick pulse to the target and an example affected ion and neutral species.

Turning to FIG. 2B, an illustrative example is provided of the plasma potential profile 199 between the target electrode 220 and the substrate 250 during initial application of the positive kick pulse 212 to the target electrode 220 and an example of affected ion and neutral species. Immediately after terminating the main negative pulse 210, the positive kick pulse 212 (+Vkick) reverses a potential across the magnetic confinement zone 230 that, in turn, causes a pulling of electrons back into the target electrode 220 and a collapsing of the main negative sheath 202. This elevates the kick potential drop positive 204 and creates a transient positive voltage drop across the dense plasma zone 231 and the magnetic confinement region 230. This, in turn, directs ions away from the target electrode 220 that would have been recycled or lost. The process is similar to Hall-effect thrusters, where a positive voltage reversal is established as a positive kick pulse potential drop 204 across the magnetic confinement region 230, and the positive potential distribution follows a Morozov-like potential distribution shaped by the magnetic field contours. The ions are accelerated by the potential of the kick pulse and generate an accelerated controlled-energy ion flux 242 that is directed towards the substrate 250. Thus, the positive kick pulse 212 has an effect of: increasing the deposition rate, increasing the total number of ions reaching the substrate, and adding bias energy to the ions without any additional hardware at the substrate for biasing—this is ideal for dielectrics, low-temperature materials, or for applications where electrical connections are difficult such as web or roll-to-roll coatings. The effect facilitates controlling the ion energy distribution function by changing kicker pulse height, duration and onset relative to the substrate. The pulse configuration, control, and generating circuitry architecture depicted in FIG. 1 facilitates adjusting: the kick pulse voltage (energy), the pulse width, pulse length, pulse delay and other settings for precise control of ion energy directed from the target electrode 220 to the substrate 250.

With continued reference to FIG. 2B, one mode of operation of the main/kick pulse generating system depicted in FIG. 1 is to employ short pulse widths on the main negative pulse 210 (i.e. 10 usec) at very high main negative pulse 210 voltages (i.e. 1000V) to generate a transient, high-density discharge, and then immediately reverse the potential with application of the (opposite polarity) kick pulse 212. The high voltage drives current up to >>1 A/cm2 quickly but the short pulse width does not give enough time for significant ion recycling. However, the duration is long enough to bootstrap a dense ionization zone and plasma density. The transition to kick pulse 212, which is output via cabling 30, then converts these ions into accelerated controlled-energy ion flux 242. High pulse repetition rate directly correlates to high deposition rate with high ionization fraction and directed ion energy for desired physics at the substrate for thin-film deposition. For some applications desiring minimization of compressive stress in the thin-film due to carrier gas ion implantation, using a short kick pulse 212 timed after argon gas rarefaction and self-sputtering mode the accelerated controlled-energy ion flux 242 can minimize entrained argon ions and predominantly be ionized sputtered material. The short kick pulse will move metal ions but not increase the plasma potential at the substrate to minimize argon implantation.

Figure 2C:
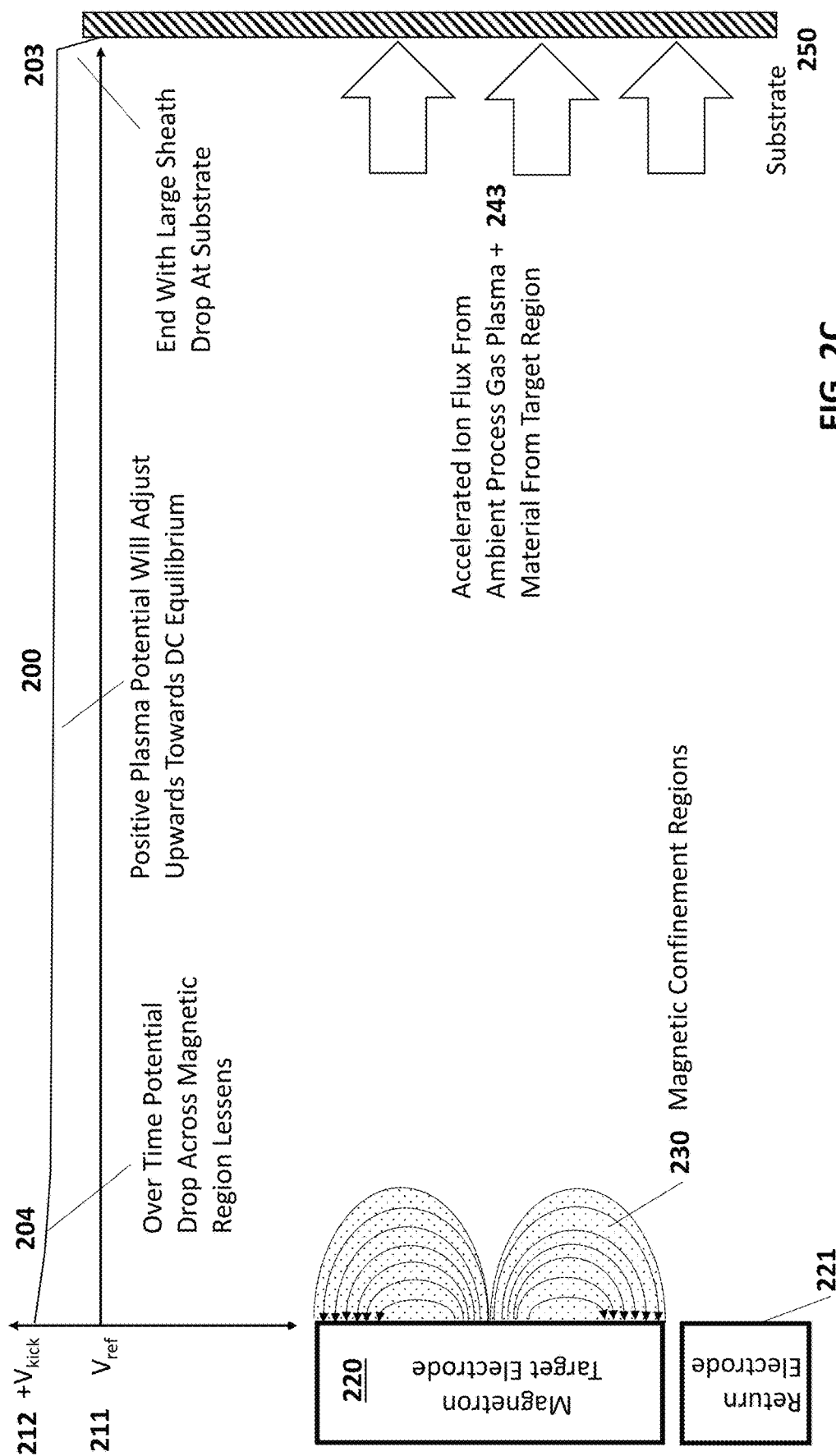
FIG. 2C illustratively depicts a plasma potential profile between a target electrode and a substrate after a temporal evolution of a positive kick pulse to the target and an example affected ion and neutral species.

FIG. 2C illustratively depicts the plasma potential profile 199 between the target electrode 220 and the substrate 250 after applying a long positive kick pulse 212 output via the cabling 30, to the target electrode 220. Over time the positive kick pulse potential drop 204 lessens across the magnetic confinement region 230 as the plasma equilibrates across the chamber. As a result, the bulk plasma potential 200 will commute with the target electrode 220 and elevate the entire positive column towards the positive kick pulse voltage 212. This will lead to a steep anode sheath 203 at the substrate 250 and the acceleration of a bulk plasma ion flux 243 to the substrate 250. The bulk ion flux 243 will include ion species present in the chamber and near the substrate 250, e.g. argon ions. The additional ion energy may be advantageous for certain thin-film applications. However, for many applications the additional ion energy is not desired and may be selectively reduced by varying the (positive) kick pulse width and timing relative to the (negative) main pulse.

Figure 3:
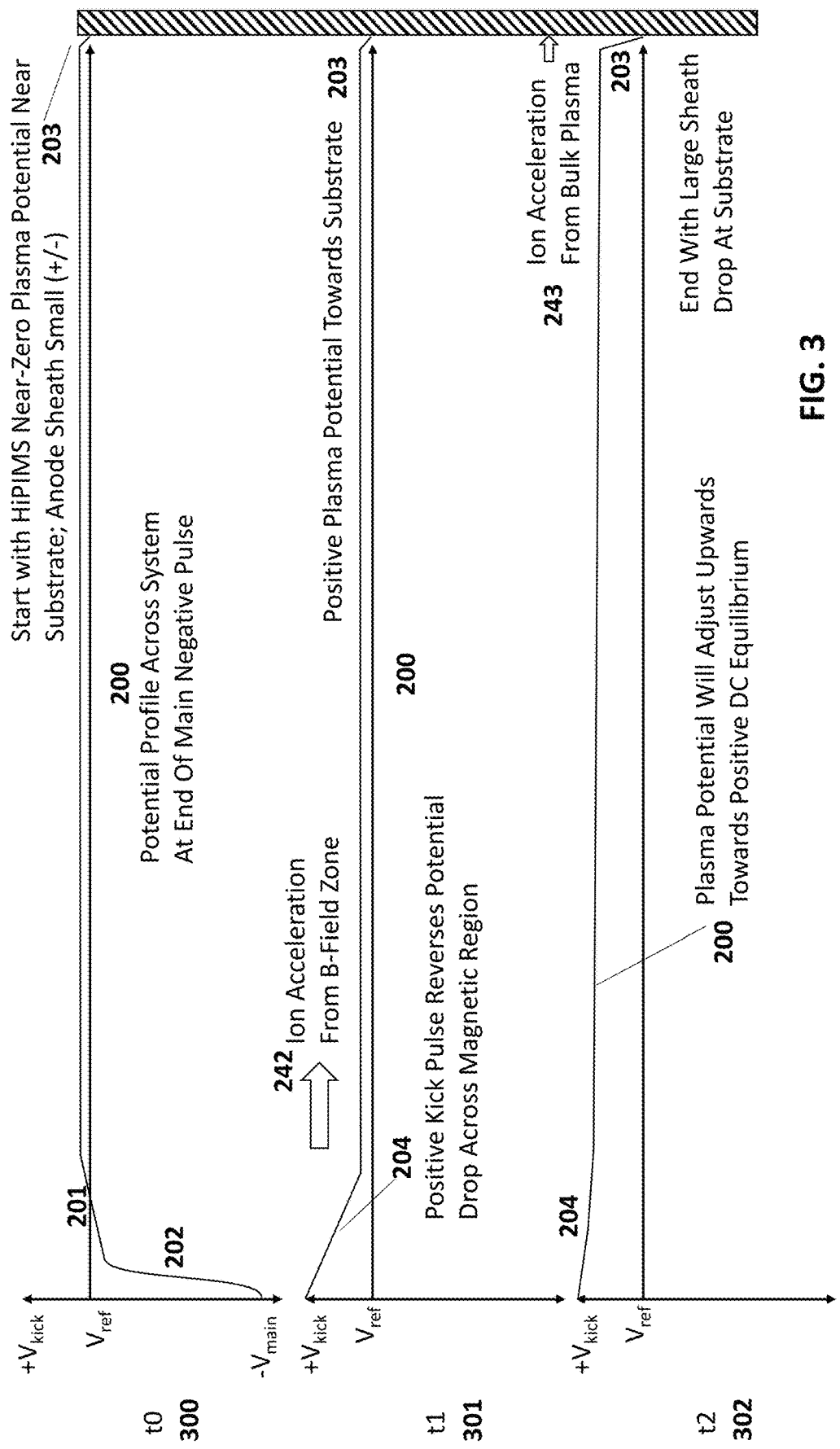
FIG. 3 illustratively depicts a composite of a temporal potential evolution at time t0 (main pulse termination), t1 (early positive kick pulse application), and t2 (later positive kick pulse effects)

There is a time evolution component to the positive kick pulse effect on the plasma and ion energy distribution as seen by the substrate 250 and target electrode 220. FIG. 3 illustratively depicts the temporal potential evolution at: time t0 (300 main pulse termination), t1 (301 early positive kick pulse application) and t2 (302 later positive kick pulse effects). The local plasma potential in the vicinity of the substrate 250 will start out negative or near zero during the main HiPIMS negative pulse (t0). However, once the positive kick pulse (output via cabling 30) is applied to the target electrode 220, electrons will be drawn out of the system and the plasma potential will elevate positive and commute to the surface of the substrate 250 (floating, grounded or actively biased). The positive kick pulse, which is generated on the output cabling 30 of the system depicted in FIG. 1, accelerates ions from the magnetic trap with the remainder of the positive kick pulse magnitude that exists across the B-Field region (at t1). The potential structure will evolve over time until the target potential is commuted across the gap, thereby raising the local potential up to near (or above) the kick potential (at t2). Thus, the magnitude and duration of the kick pulse is adjustable to provide configurable/tunable metal ion acceleration from the dense plasma region with energies of >50 eV while minimally influencing the plasma potential near the substrate—this is useful to minimize the effect of implanted argon ions for example and favor the implantation of metal ions. The positive kick pulse magnitude is varied according to need/desired function. A value between 50-150V is typically chosen to avoid etching of the substrate for most applications. However, where etching and hybrid deposition-etching applications are desired, the illustratively described system provides the flexibility to achieve such functionality.

Figure 4:
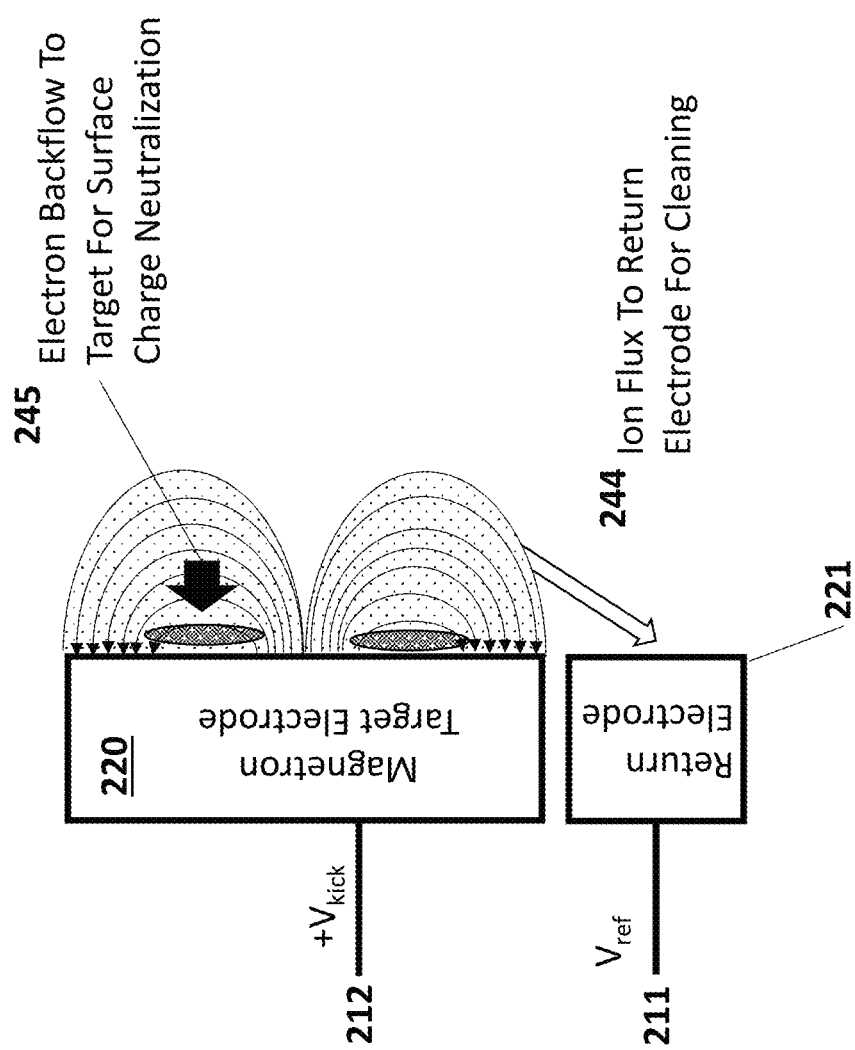
FIG. 4 illustratively depicts an effect of the positive kick pulse on a target due to electron backflow and an energetic ion flow to an anode return electrode.

Another aspect of the described exemplary system is that the positive kick pulse generated by low inductance power output circuits of the highly configurable and tunable system depicted in FIG. 1, provides a return electron current that may be used to supply a power signal via the output cabling lines 30 to neutralize surface charging on target electrodes that arises from RF or pulsed DC operation, especially for reactive gas environments. FIG. 4 illustratively depicts an effect of the positive kick pulse 212, which is provided by the system depicted in FIG. 1, on the target electrode 220 due to electron backflow and energetic ion flow to the anode return electrode 221. The polarity reversal of the output on cabling lines 30, which is received by the plasma generator (also referred to herein as a magnetron sputtering gun) including the target electrode 220 and the return electrode 221, immediately draws in electrons from the dense plasma HiPIMS zone 231. The electron backflow 245 to the target electrode 220 is instrumental in negating surface charge buildup since the higher mobility electrons will migrate to areas of stored surface charge and insulating regions. A portion of an ion flux return 244 will be self-directed towards the return electrode 221 which is prone to material buildup and the "disappearing anode phenomena". Thus, the (positive) kick pulse 212, which is output on the cabling lines 30 of the system depicted in FIG. 1, greatly enhances a reactive sputtering operation because surface charge buildup may be managed and mitigated through proper waveshaping of the magnitude and duration of the positive kick pulse 212, while the anode return electrode 221 may be properly maintained, thereby lowering the physical cleaning steps needed for vacuum chamber maintenance. The positive kick pulse 212 generated by the system depicted in FIG. 1 is thus advantageously incorporated as input to a plasma generator for reactive sputtering applications where HiPIMS is shown to be desirable due to the ability to run at higher power densities without poisoning or contaminating a target. Operation with 100% N2 or 100% O2 reactive gas is possible to completely eliminate the need for argon carrier gas.

Figure 5:
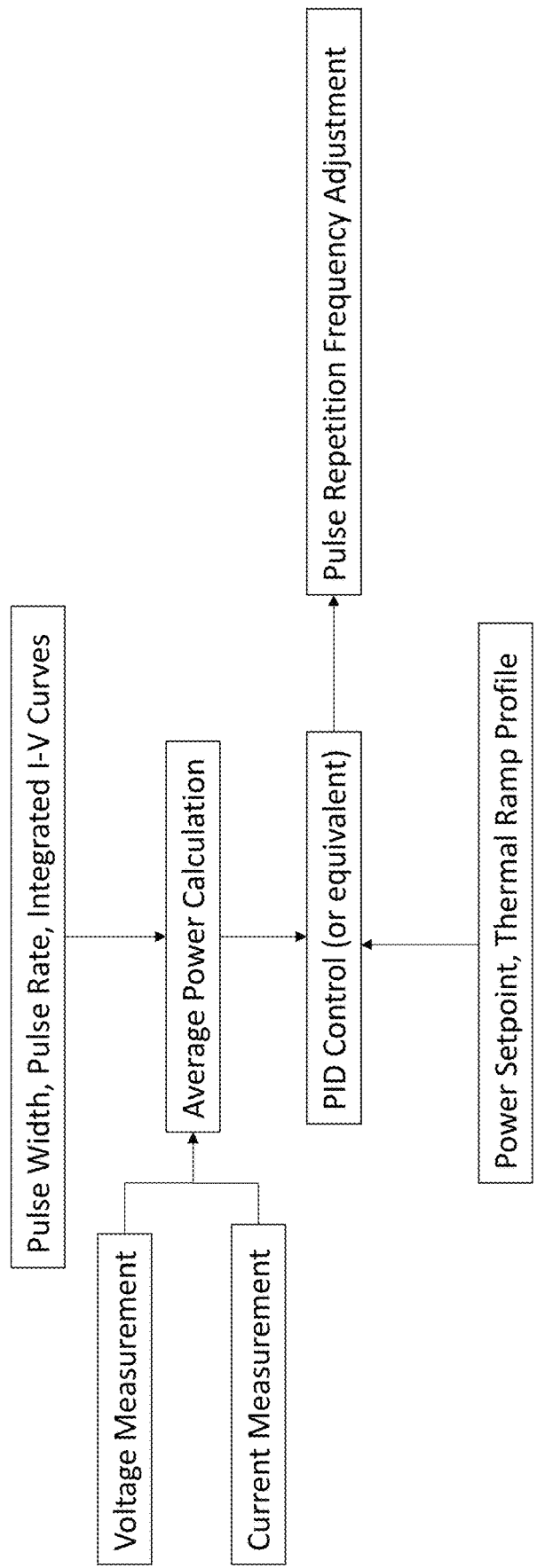
FIG. 5 schematically depicts a feedback based arrangement, for controlling a constant power mode, for automatically throttling repetition rate.

FIG. 5 is a block diagram schematically depicting a constant power mode of operation of the system in FIG. 1 that includes automatically throttling a repetition rate. A PID controller (or equivalent) receives several input parameters (identified in the drawing figure) and renders an adjustment to a currently specified pulse repetition period/frequency. Examples of the input parameter values include: voltage and current measurements; pulse width, pulse rate, and integrated I-V curves which the PID controller uses to render an average power calculation. The PID controller combines the average power calculation with a received/stored set of power set points and thermal ramp profiles, to render an output pulse repetition frequency (adjustment). In the illustrative example, the PID controller receives in-line monitoring parameter values indicative of the I-V waveform. Such monitoring by the controller/processor facilitates dynamically controlling the pulse repetition rate to maintain a constant average power on the target electrode 220 for maximum power utilization as conditions change over time. This is critical for target materials that require a slow ramp rate for thermal cracking and coefficient of thermal expansion (CTE) mismatch. Also the total target power is also an issue to ensure the material does not melt and short the anode return electrode.

Figure 6:
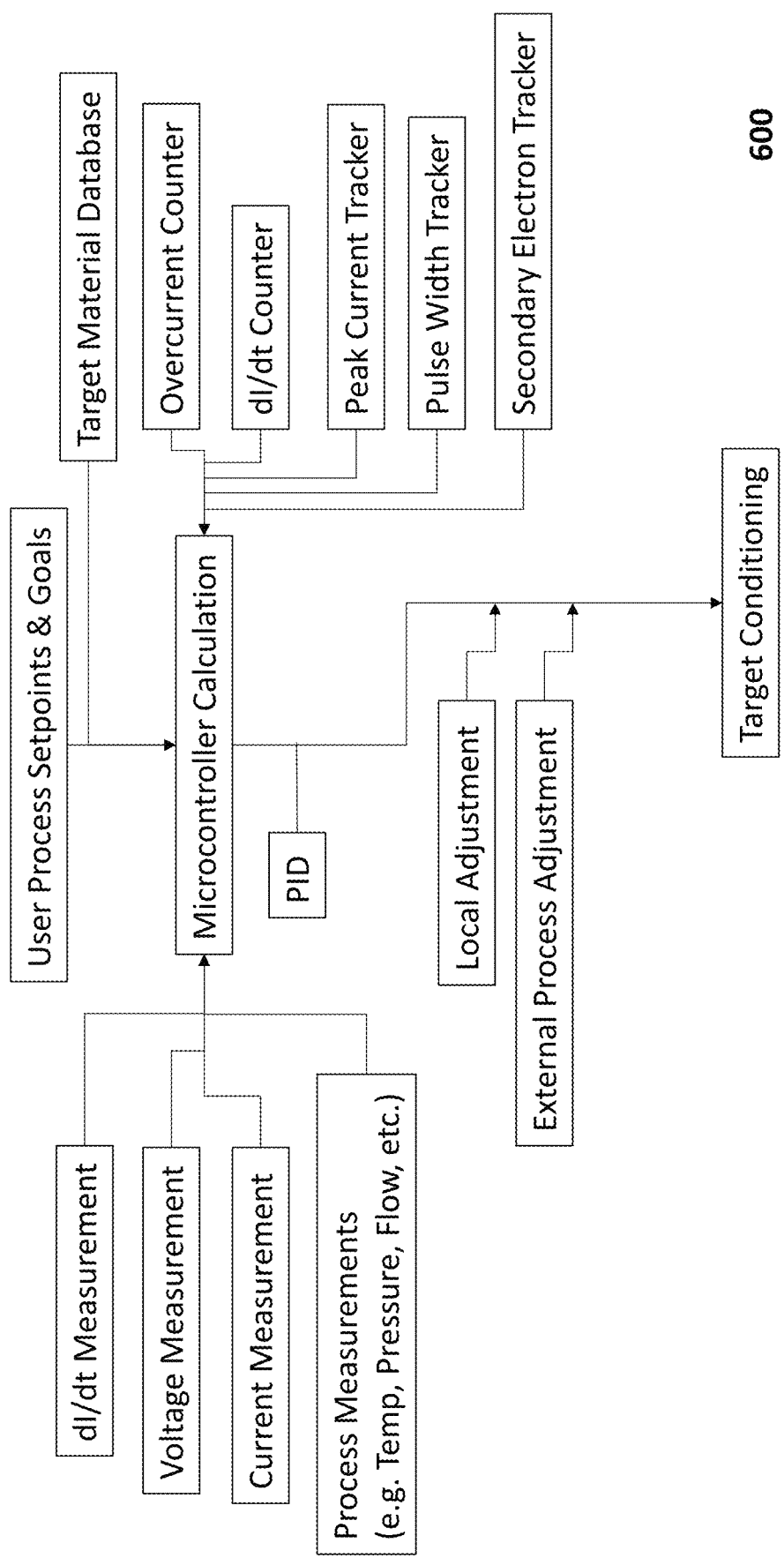
FIG. 6 schematically depicts an arrangement for conditioning in new target materials, or targets that have been contaminated, prior to deposition.

FIG. 6 is a block diagram, using a similar form as FIG. 5, schematically depicting representative/exemplary inputs and corresponding outputs of an auto conditioning mode of operation of the system in FIG. 1 that operates to break in new target materials or ones that have been contaminated prior to deposition. New sputtering targets are usually "conditioned" prior to actual deposition on the substrate. Conditioning is needed to gently remove surface contamination in the form of oils (fingerprints, machining oils), cleaning solvents, surface reactions in the form of oxides, nitrides and hydrides from air and moisture exposure, and reactions from the presence of other processing gases inside the deposition system. New targets may also contain surface stresses, cracks and imperfections from machining or material fabrication processes, e.g. cutting, milling and polishing a 3-inch target. These microscopic target imperfections and contaminants lead to local field enhancement at the surface that can lead to cathodic arc formation, cratering, debris generation and even target crack failure.

FIG. 6 schematically depicts a system that employs processing inputs, output monitors and local adjustment of process parameters with user set points and a material database. Conditioning uses a potentially wide variety of input measurements including measurements indicating dI/dt, dV/dt, overcurrent and present effect of power control features on a target plasma generating system. Once voltage conditioning is completed, current conditioning may be attempted by increasing the pulse length to achieve higher peak currents, or power conditioning may be attempted by increasing the repetition rate for time average power delivered to the cathode. Once a target is conditioned, it is not necessary to repeat the procedure for each startup. Like DC sputter conditioning, the startup process consists of igniting the plasma at a low power density and gradually ramping or stepwise increasing the voltage, peak current and total power generated and delivered by the system depicted in FIG. 1 to the target electrode 220 over a given length of time (typically several minutes per increment). Because HiPIMS is inherently pulsed at higher voltages to generate high peak currents, the conditioning process is voltage and time dependent. Thus, the general conditioning sequence is: condition for voltage, condition for peak current, and lastly condition for power (thermal).

The general rule for driving a plasma generator is to generate output (on cable lines 30) having short pulse widths (e.g. 10-25 μs) at a low repetition rate (e.g. 20 Hz) such that peak current (e.g. 20-100 A) is not reached before the pulse ends. This initial stage is followed by a stepwise increase to the operating voltage (e.g. 10-20V "rise" for each step) until the number of overcurrent events per second (see "overcurrent counter" in FIG. 6) is less than 1 arc/sec (e.g. a few minutes of "soak"). The plasma generator should use a standard noble sputtering gas, such as Argon, at a moderately high pressure (e.g. 20 mTorr). The actual conditioning time and rate of rise will depend on the target material and the margin level desired, e.g. 20-50V over nominal operating level. Each stepwise "rise" may lead to additional conditioning events on the target surface (e.g. a new type of contaminant material that will be cleaned off at the new/higher voltage level, a stepwise reaching of a critical electric field localized around defects, etc.). The goal is to achieve desirable HiPIMS waveforms for standard operation and to condition the target above the voltage, pulse width and repetition rate values for the desired waveform condition. At some point a peak current level is reached, and the pulse width is reduced (either under programmed control or user/manual control) to continue voltage conditioning the sputtering target.

In general voltage conditioning may be sufficient to prepare a target for operation. However, some target materials may require current and power conditioning to achieve a relatively quiescent state for very low event HiPIMS sputtering. Additional secondary steps of current (plasma density) and power (thermal) conditioning may be required. The processes of current and power conditioning are similar to the above-described voltage-based conditioning. In the case of current conditioning, the current limit threshold value is increased in stepwise increments of, for example, 10-20 A, and the pulse width is increased to allow higher current density at the target surface. For power conditioning, the power limit is increased, for example, in 10-20 W intervals using a "Power Limit" configurable parameter control feature, and the system adjusts the repetition rate until power is stabilized to the target. By way of example, a user can directly control power level via adjustments to a pulse frequency by manually increasing the repetition rate in, for example, 1 Hz intervals. For example, a fixed amount of power is transferred to the target during each HiPIMS pulse period. Therefore, increasing the repetition rate of the pulse period proportionally increases the delivered power.

Another feature of the illustratively depicted example in FIG. 1, is the ability to control multiple electrical power pulse sources (each source being coupled to a corresponding instance of the output cabling 30 depicted in FIG. 1) to operate multiple sputtering guns for co-deposition, multi-layering or graded coatings and the application of substrate biases. This is achieved by setting one pulsed power module as a master and achieving multi-unit operation via the master communicating with multiple slave units. This facilitates user control of the onset of a delayed pulse relative to another. This is ideal for superconducting material coatings where the presence of implanted argon ions in a substrate is avoided. However, energetic niobium is preferred for improved crystallinity and low loss.

Figure 7A:
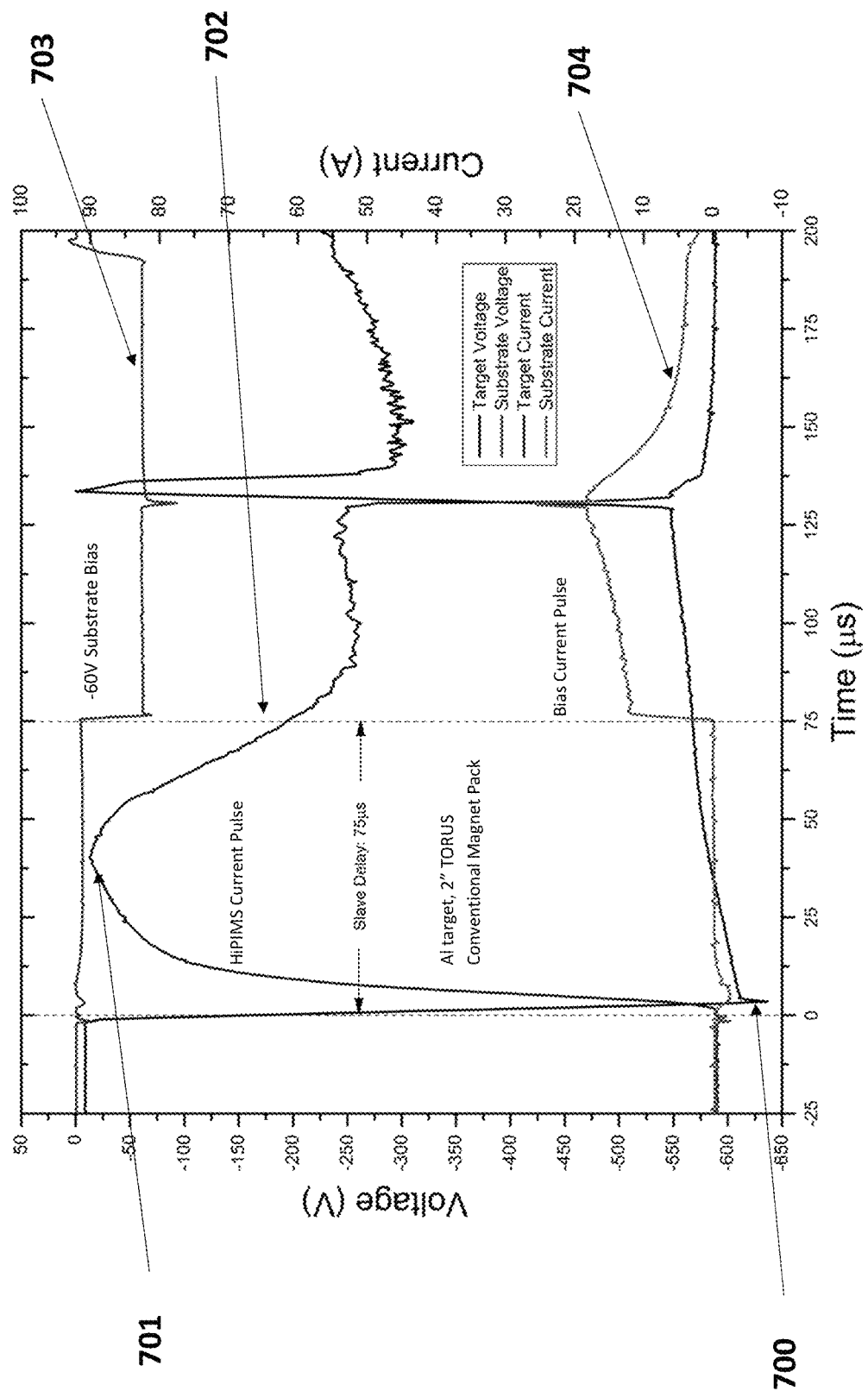
FIG. 7A illustratively depicts a representative plot of generating a HiPIMS discharge on a 2-inch Al sputtering gun operating in a master mode and driving a slave unit for timed application of a substrate bias to attract and draw predominantly metal ions from a HiPIMS pulse after a gas rarefaction phase near a target is completed.

FIG. 7A is a representative plot of a baseline system generating a HiPIMS discharge on a 2-inch Al sputtering gun in Master Mode driving a Slave unit for timed application of a substrate bias to attract and draw predominantly metal ions from the HiPIMS pulse after the gas rarefaction phase near the target is completed. In this example, the main negative pulse 700 is triggered on a master unit at time 0 usec causing plasma breakdown and exponential ramp in discharge current in a few microseconds to the ~0.1-1 A level.

Self-sputtering begins to contribute and drives the discharge current 701 more than 2 orders of magnitude higher towards a peak near 90 A near 40 usec. The argon gas used as the primary sputtering gas becomes rarefied and depleted near the surface of the aluminum sputtering target; this causes the total pulse current to decrease and settle into the metal-dominated mode at time 75 microseconds.

At this point another pulsed power module, acting as a slave, is triggered based on a slave delay 702 with a substrate bias 703. The substrate bias persists some time period after the termination of the master pulse with the intent of accelerating metal ions generated during the HiPIMS pulse but ignoring the initial wave of argon ions generated in the first few microseconds for the plasma breakdown and the cold argon ions in the bulk residual plasma afterglow. The substrate current 704 can capture a higher fraction of metal ions from the plasma vs. argon ions from the carrier gas. This can lower film stress from implanted argon and improve film quality. The ability to synchronize timing is an important feature of this innovation. Sputtered metal atoms and ions (without kick) will have several eV of energy versus the cold ionized background argon gas (0.1-0.2 eV). The transit time to the substrate can be used to window the substrate bias to select which group of particles will arrive or which group will be accelerated to the substrate.

Figure 7B:
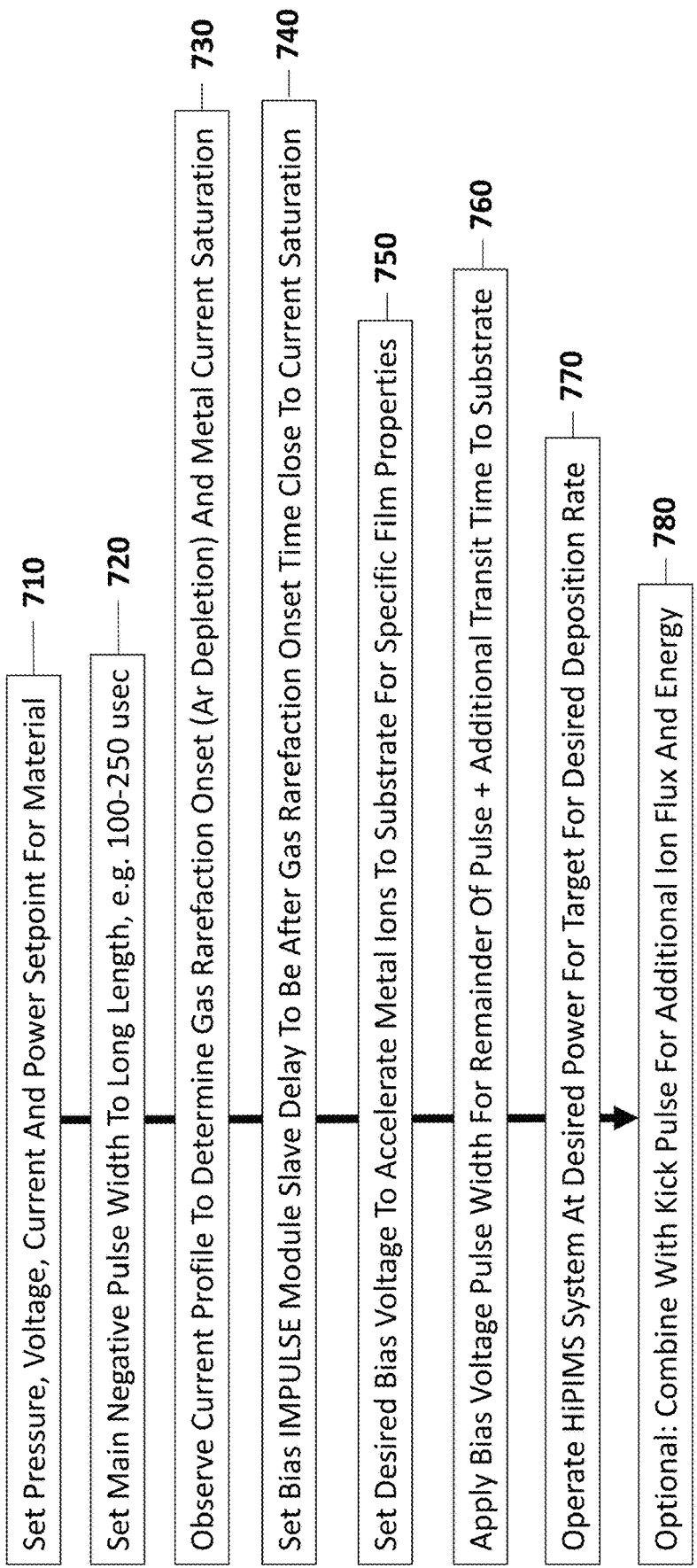
FIG. 7B illustratively depicts a set of operations for a synchronized substrate bias delay, general operation method and a setup.

FIG. 7B is a flowchart diagram depicting a set of steps associated with the synchronized substrate bias delay, general method and setup conditions. An example process could be to setup the vacuum deposition system with a suitable target material, distance between the sputtering gun and the substrate to be coated; and set the pressure, voltage, max current, and power set point (thermal ramp) during 710. During 720, a user configures the operation of the system depicted in FIG. 1 to generate a desired pulse sequence by setting the main negative pulse width to a long length (e.g. 100-250 usec) such that the argon carrier gas will have sufficient time to rarefy and deplete—leaving only metal vapor plasma from the self-sputtering mode.

During 730 the plasma I-V waveforms are observed during pulsed operation (e.g. look for a drop in peak current—indicating the argon depletion has occurred).

During 740, the substrate pulsed bias unit is set in slave mode with a delay to be close to current saturation.

During 750, the bias voltage is set on the slave unit for the desired voltage to accelerate ions into the film, e.g. −200V, for the desired properties.

During 760, the slave unit pulse width is set for the reminder of the main negative pulse 720 plus an additional amount calculated from the ion transit time for a 1-3 eV ion (speed based on mass) and the distance from target electrode to the substrate (e.g. 15 cm). This slave bias pulse width, specified during 760, will focus on metal ions from the target.

During 770, the HiPIMS system is operated at the desired power for the target with the slave pulse timings for the desired deposition rate.

During 780, the process may be optionally combined with the positive kick pulse to add further selection and windowing of target material ion acceleration to the substrate by taking advantage of the timing and time-of-flight windowing of the pulsed bias. A short kick pulse will accelerate predominantly the metal ions from the target and give this group (the controlled-energy accelerated ion flux) a higher velocity and specific timing that can be used for windowing the substrate bias for further ion implantation while minimizing argon or other species from implanting into the film.

Figure 8:
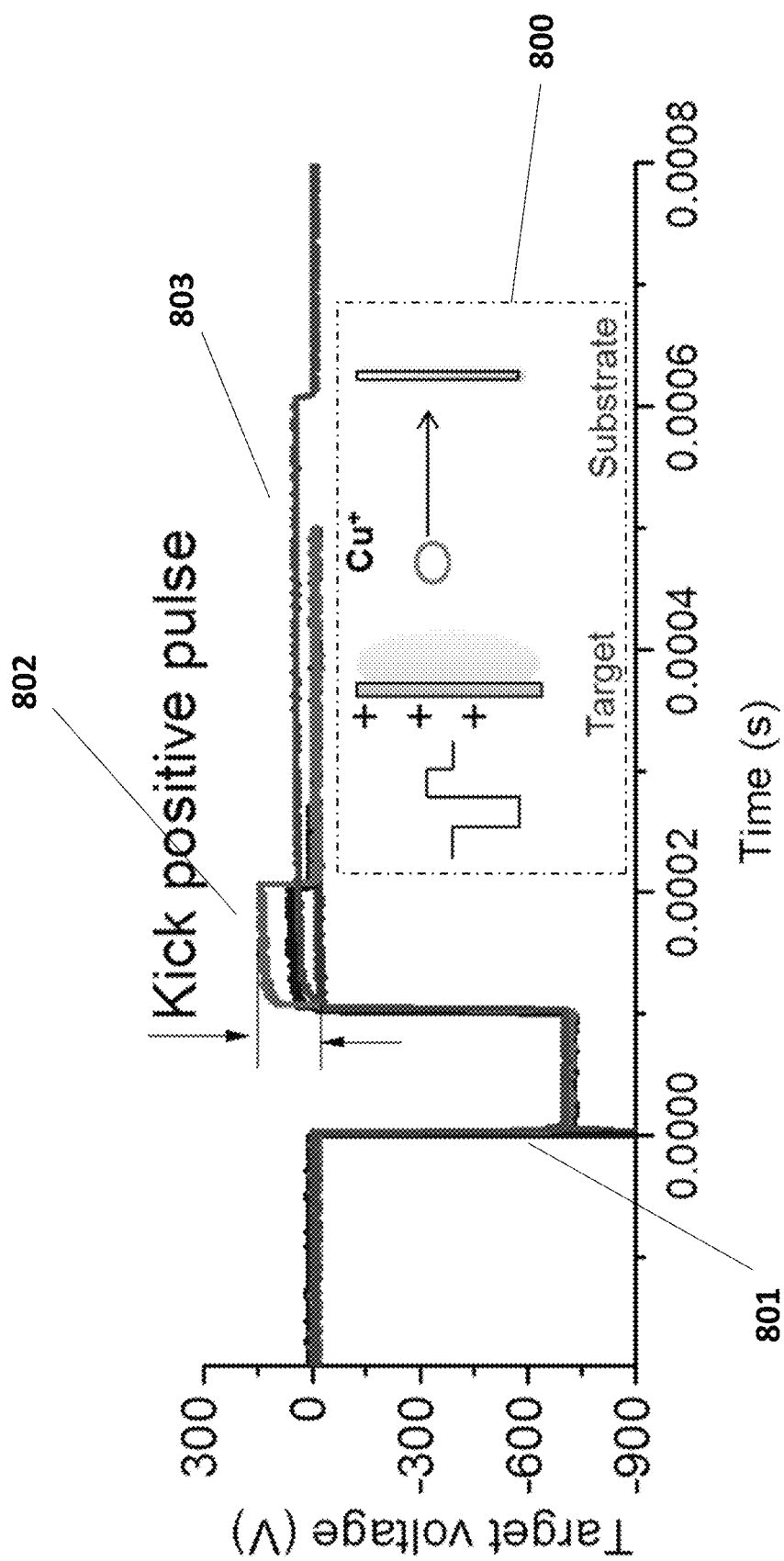
FIG. 8 illustratively depicts a composite of several oscilloscope waveforms demonstrating multiple different positive kick pulses applied to a same type of main negative sputtering pulse.

An example V waveform over time is illustratively depicted in FIG. 8 that shows an example main negative pulse waveform followed by the adjustable positive kick pulse. FIG. 8 is a composite of several oscilloscope waveforms demonstrating multiple different positive kick pulse amplitudes 802 and positive kick pulse durations 803 applied to a same type of main negative sputtering pulse 801. The overall graphic depicting ions transferred to the substrate 800.

Figure 9A:
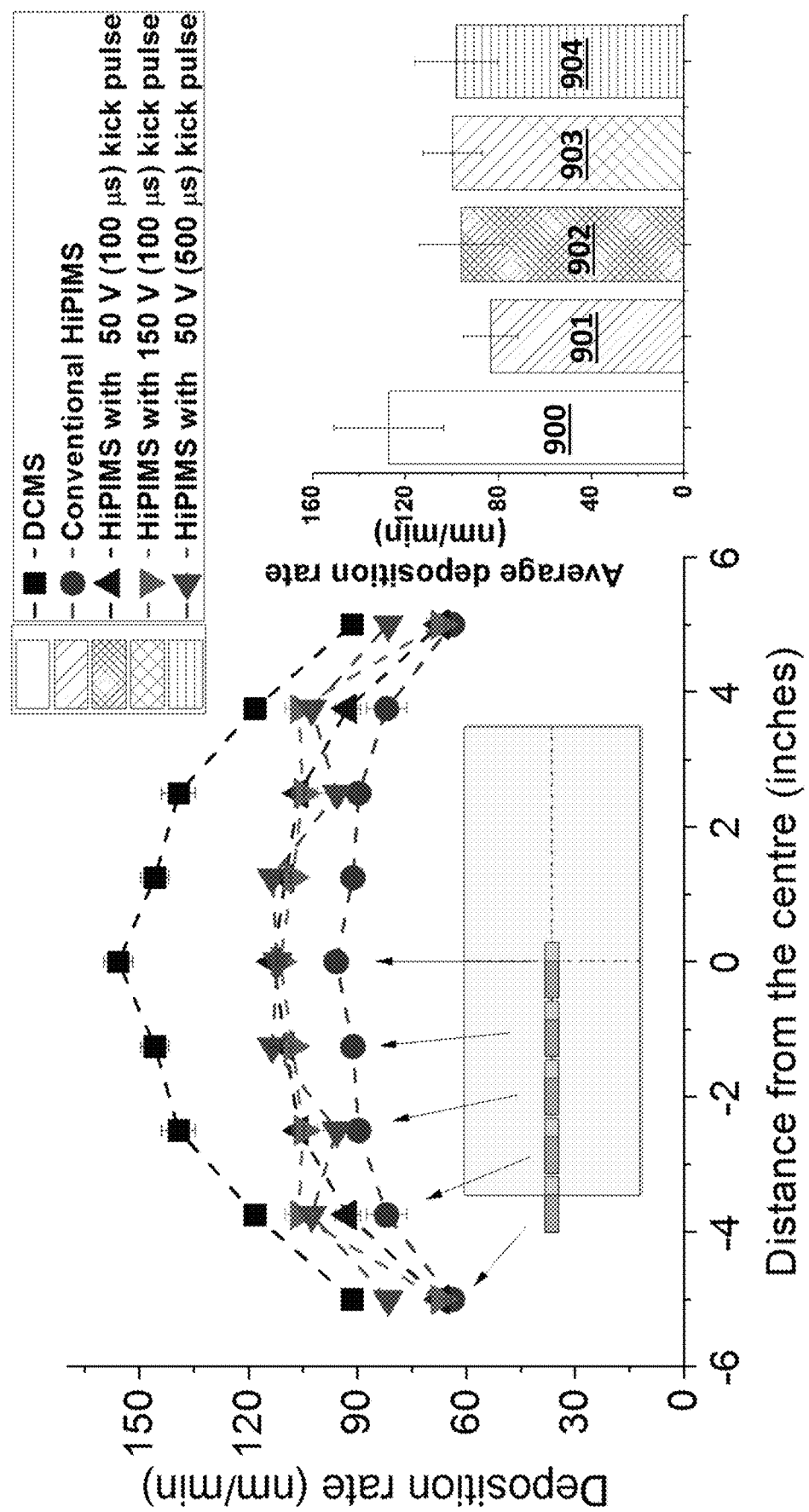
FIG. 9A illustratively depicts a example data set taken on a rectangular magnetron cathode for DC magnetron sputtering, conventional HiPIMS, and different variations of positive kick pulses for effect on deposition rate.

FIG. 9A graphically depicts experimental data taken on a rectangular magnetron cathode for a variety of ways for driving a plasma generator including: DC magnetron sputtering 900, conventional HiPIMS 901, and multiple variations of applying an input power signal including a positive kick pulse (e.g. short-width low-amplitude 902, short-width high-amplitude 903, and long-width low-amplitude 904) and the resulting effect on deposition rate of material on a substrate. The DC sputtering deposition rate is higher compared to HiPIMS. However, the DC sputtering approach results in an ionization fraction that is low (e.g. ~1-3%). Conventional HiPIMS ionization fraction is 30% with a corresponding drop in deposition efficiency. Applying a positive kick pulse improves the overall deposition rate and increases the ionization fraction (e.g. an increase of 16-20% almost up to 50% total). This shows a 16% increase in deposition rate under these conditions for 100 usec main pulse with 100 usec positive kick pulse at +50V for Cu target at −730V, 600 Hz and 8 mTorr Ar pressure. This has a remarkable affect on (reduction of) film stress.

Figure 9B:
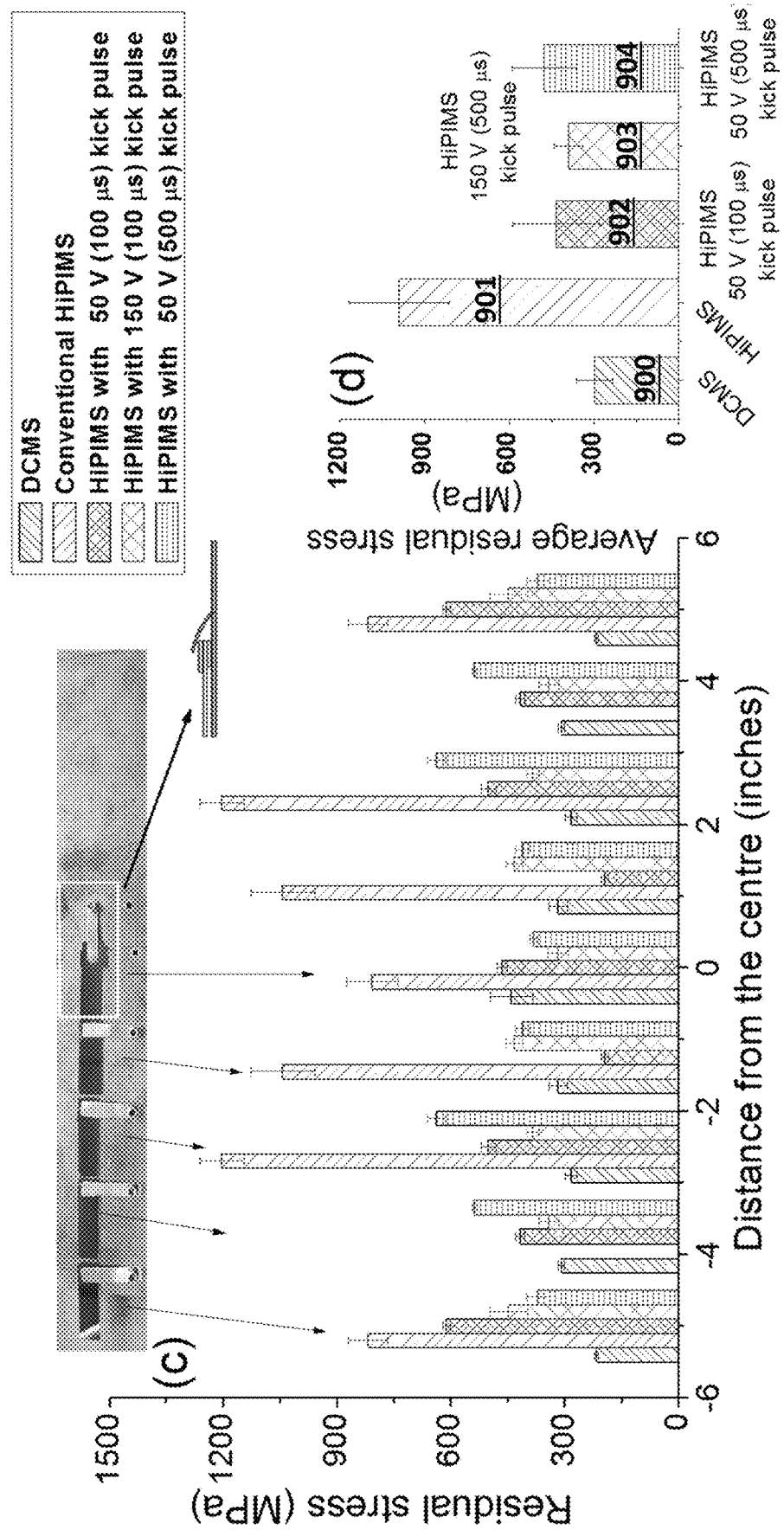
FIG. 9B illustratively depicts an example data set taken on a rectangular magnetron cathode for DC magnetron sputtering, conventional HiPIMS, and different variations of positive kick pulses for effect on film stress rate.

FIG. 9B graphically depicts experimental data taken on a rectangular magnetron cathode for a variety of ways for driving a plasma generator including: DC magnetron sputtering 900, conventional HiPIMS 901, and multiple variations of applying an input power signal including a positive kick pulse (e.g. short-width low amplitude 902, short-width high-amplitude 903, and long-width low amplitude 904) and the resulting effect on film stress rate. Correspondingly film stress is changed by altering the additional imparted ion energy from the kick pulse. Application of the positive plasma kick is evident in scanning electronic microscope (SEM) images showing grain coalescence and transition to a glassy morphology as a consequence of the additional ion energy imparted on the substrate surface during the deposition in comparison to conventional HiPIMS and DCMS approaches. The configurable/adjustable positive kick pulse provides the ability to control film stress with rapid energy deposition and ion densification allowing films to achieve Zone T on the Thornton diagram with the transition from tensile to compressive stress with stress annealing properties of pulsed thermal annealing from the increased ion energy deposition at the thin-film. The timing, delay, magnitude and duration of the positive kick pulse allows adjustments/control of: ion fraction, ion composition (i.e. metal vs. argon), ion implantation, transient energy flux for annealing, and control of film stress, adhesion and surface functionalization. Imparting ion energy at higher levels/rates can improve interface mixing and adhesion for the HiPIMS layer bonding.

Figure 10:
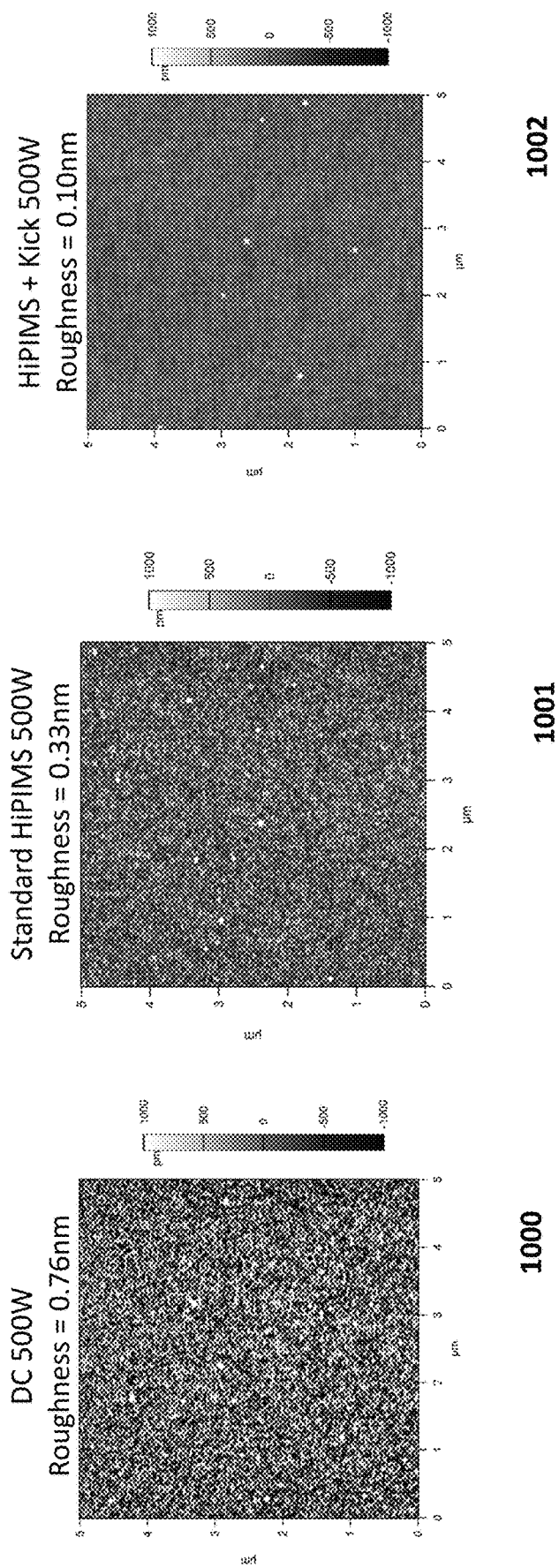
FIG. 10 illustratively depicts an example set of surface roughness data taken from a 3-inch cylindrical sputtering gun depositing at-C (amorphous tetrahedral carbon) using the invention herein with and without kick pulse compared with conventional DC sputtering.

FIG. 10 is a photographic illustration providing an example surface roughness data taken from a 3-inch cylindrical sputtering gun depositing "at-C" (amorphous tetrahedral carbon) using the baseline system described herein with and without kick pulse compared with conventional DC sputtering. The adjustable kick pulse provides ion energy and more ions for modification of the surface properties. As clearly shown, the surface treated using the kick pulse achieved a noticeably smoother surface.

Figure 11:
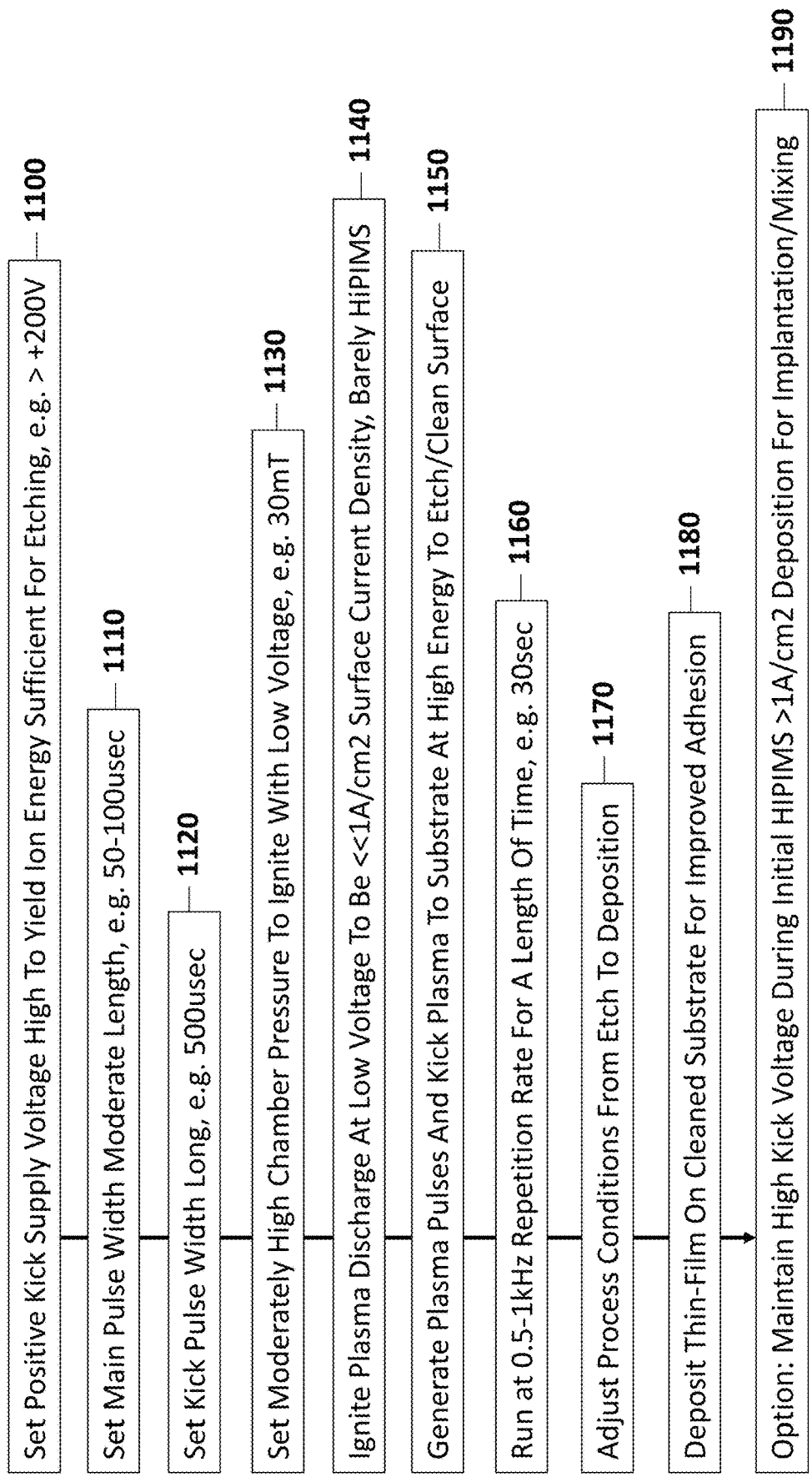
FIG. 11 illustratively depicts a set of operations for a setup and an etch cleaning of a substrate using a positive kick pulse and a transition to mixed deposition-implantation for graded interfaces.

FIG. 11 is a flow diagram depicting operations of a method and setup for etch cleaning a substrate using the positive kick pulse and transition to mixed deposition-implantation for graded interfaces. An illustrative example for this process is as follows. The deposition system is configured with a substrate, plasma sputtering unit and gas flow/pumping means to control pressure and gas type. During 1100, the positive kick pulse supply voltage is set to a high value above the sputtering coefficient for surface contaminants to etch these materials away. The positive kick pulse supply voltage could also be set above the substrate material etching threshold to remove surface material and thereby etch the physical substrate. This etching is ideal for removing surface imperfections, cracks, stresses and machining damage on a surface of the substrate prior to deposition and thin-film growth, e.g. on a piece of tool steel to be coated with an ultra-hard, lubricious wear coating.

During 1110 the main pulse width is set to moderate length (50-100 usec), and during 1120 the kick pulse is set to a long (e.g. 500 usec) duration. During 1130 a moderately high chamber pressure is set to ignite plasma with a low voltage (e.g. 30 mT). During 1140 the plasma discharge is ignited at low voltage to maintain <1 A/cm2 surface current density to avoid self-sputtering and transition to metal-dominated plasma. This generates the maximum amount of argon plasma and argon ions for sputter etching of the substrate with kick pulses during 1150. During 1160, the system is operated to run the discharge for a length of time sufficient to etch the surface and sputter the surface clean.

With continued reference to FIG. 11, during 1170, the process is adjusted from argon-dominated to metal-dominated by transitioning to HiPIMS by increasing the operation voltage on the main negative pulse to drive higher currents to transition into self-sputtering mode.

During 1180, a chamber pressure may be decreased towards normal processing parameters, and the kick voltage is lowered to deposit a thin-film on the cleaned substrate for improve adhesion.

In accordance with 1190, optionally the kick voltage remains high during the initial transition to HiPIMS to drive metal ions into the substrate at high energies to force intermixing of the target material and the substrate to build an interface layer. This interface layer can be graded or tailored for improved physical strength of the joint and to affect thermal, mechanical and electrical properties at the interface. This is ideal for diffusion barriers, changing electronics and band gaps, and allowing greater stress-strain control.

Another aspect of the illustrative examples is the ability to perform hybrid deposition and etching utilizing the dense localized plasma generation regions for plasma chemistry (e.g. chemical vapor deposition and etching products) in addition to the sputtered target material for integrated CVD/PVD/Etch reactors. The density of the dense HiPIMS plasma can be controlled to yield high ionization fractions, and the positive kick pulse facilitates providing tailored ion energy levels towards the substrate 250 to deliver deposition materials and etching products into small and/or deep features—potentially extending Bosch-type processes, selective etching and passivation/protection for complex feature processing.

Figure 12:
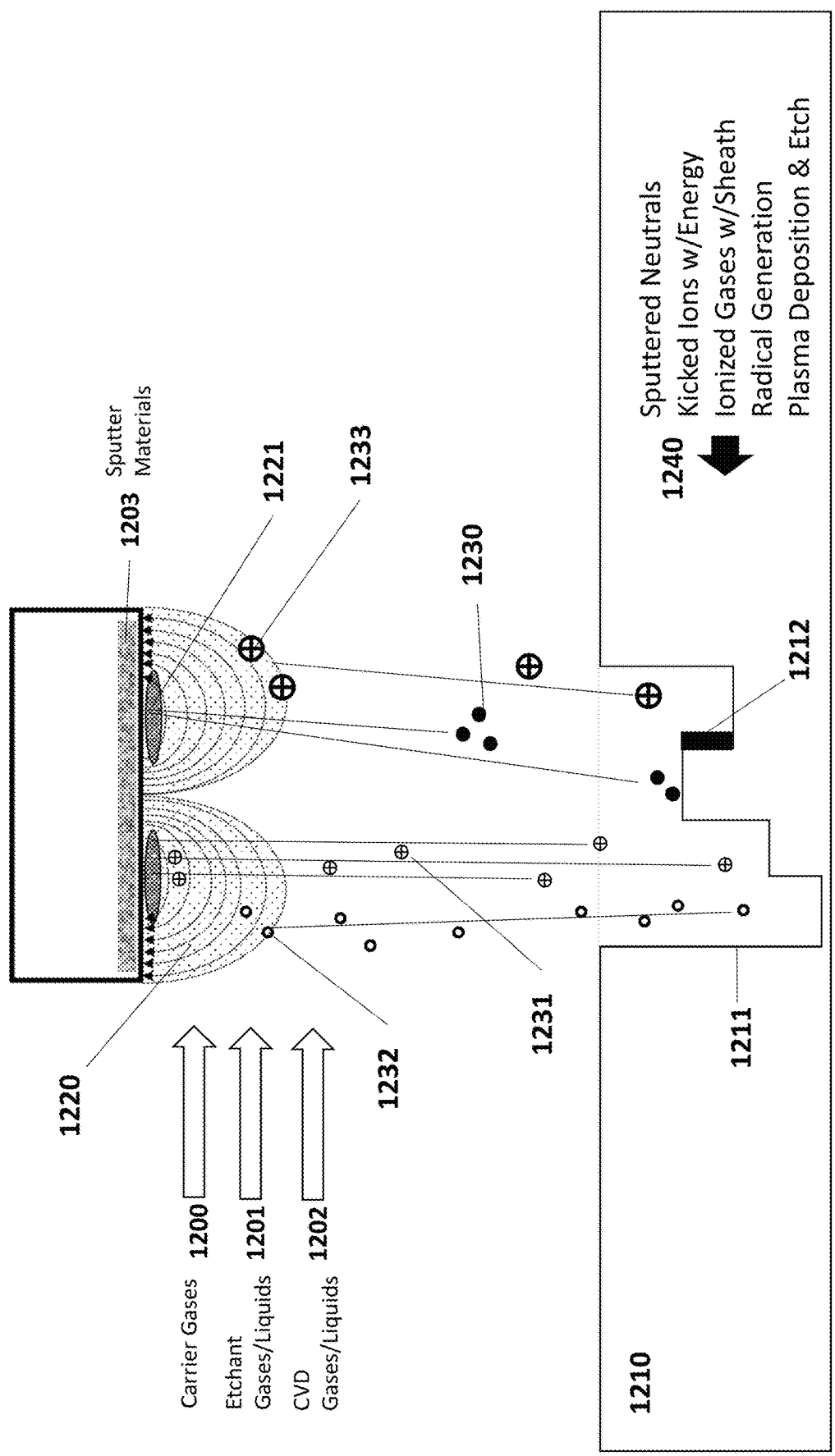
FIG. 12 schematically depicts an illustrative hybrid deposition-etching technique using an impulse power supply that drives a magnetron sputtering gun to generate dense plasma for a carrier gas, an etchant and a chemical precursor material plasma chemistry coupled with sputtered neutrals and ions that are controllably directed towards the substrate with an adjustable positive kick pulse bias.

FIG. 12 illustratively depicts operation of a hybrid deposition-etching technique 1240 using a power provided by cabling lines 30 the exemplary system depicted in FIG. 1 to drive a magnetron sputtering gun to generate dense plasma for a carrier gas 1200, an etchant 1201 and a chemical precursor material 1202 plasma chemistry coupled with sputtered neutrals 1203 and sputtered ions 1231 that are controllably directed towards a substrate 1210 using the adjustable positive kick pulse bias. The magnetic confinement region 1220 supported by the dense HiPIMS plasma in zone 1221 is dense enough to dissociate, ionize and perform plasma chemistry on the carrier, etchant 1201 and CVD gases/liquids 1202 to generate radical species 1232 and ionized precursor materials 1233. The pulsed magnetron system schematically depicted in FIG. 12 primarily sputters and delivers material to the substrate 1210. However, the kick pulse voltage can direct the ion flux into deep trenches and onto conformal features (such as the ones depicted in the substrate 1210) where protection or selective etching is needed at location 1212. Additional configurable control parameters are provided for the system depicted in FIG. 1 to facilitate adjusting pulse intensity, pulse length, pulse height, kick bias, and kick pulse duration. Additionally, chamber process conditions and material selections gives additional control of the coordinated operation of the highly configurable/adjustable power signal supply source depicted in FIG. 1 and a magnetron sputtering gun to achieve a particular functionality of the coordinated systems.

The ability to adjust the kick pulse voltage allows the user to fine tune/adjust the ion energy distribution of the accelerated controlled energy ion flux. This is important for tailoring the ion energy to be above the sputtering threshold of one material but below the sputtering threshold of another. This allows for selective etching to promote one material over another, e.g. removing sp2 graphite while leaving sp3 diamond, or simultaneous deposition and etching such that carbon is deposited and one bonding group is favored over another. The precise control of the ion energy distribution through adjustments to a variety of configurable control parameters of the system depicted in FIG. 1, including: kick pulse voltage height, pulse width, afterglow delay between the termination of the main negative pulse and the kick pulse, and the length of the kick pulse—in addition to external process variables like pressure, substrate-target gap, magnetic configuration, etc.—facilitates a wide variety of functionality for treating a vast variety of substrate surfaces. For semiconductor etching applications, the described system and technique enables new hybrid deposition-etch operation that compliments conventional Bosch-type chemical vapor etch process.

Figure 13:
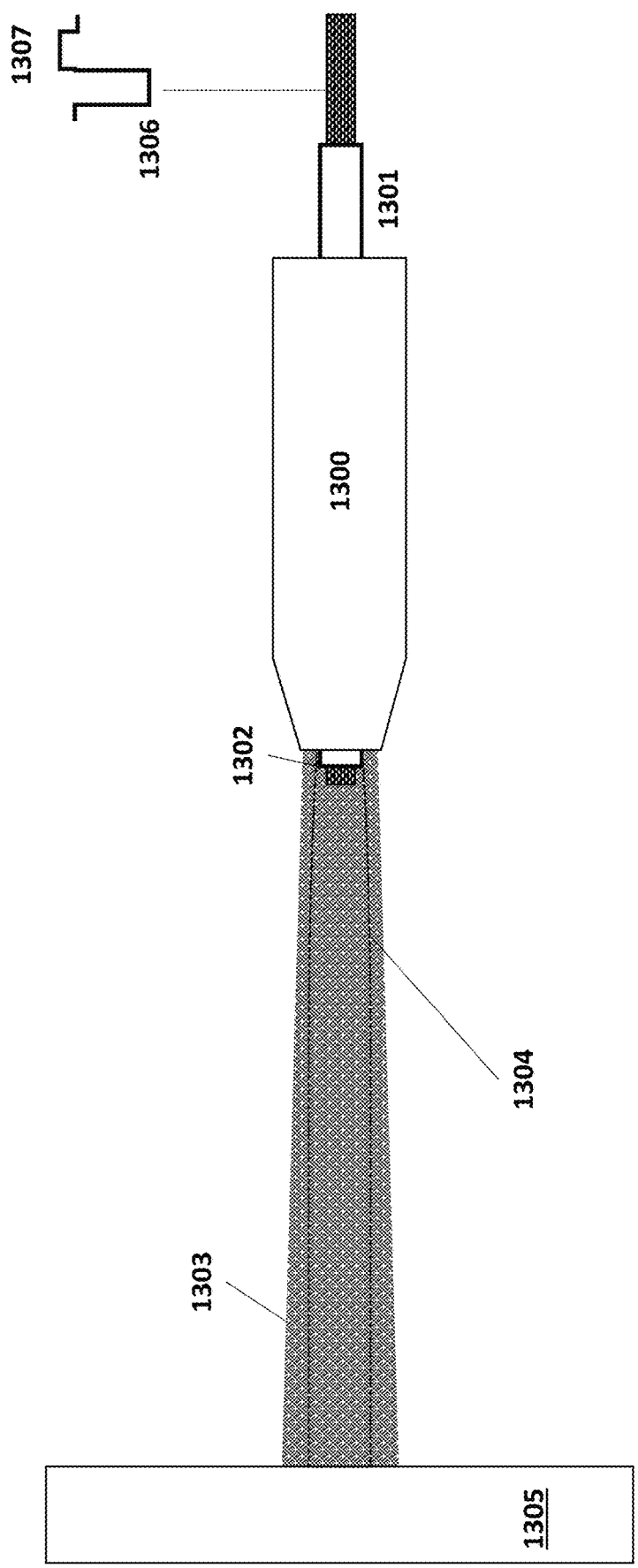
FIG. 13 schematically depicts an illustrative atmospheric-pressure plasma sputtering source driven with an impulse power supply using programmable positive kick pulses for providing ion energy to a substrate to improve film quality.
Figure 14A:
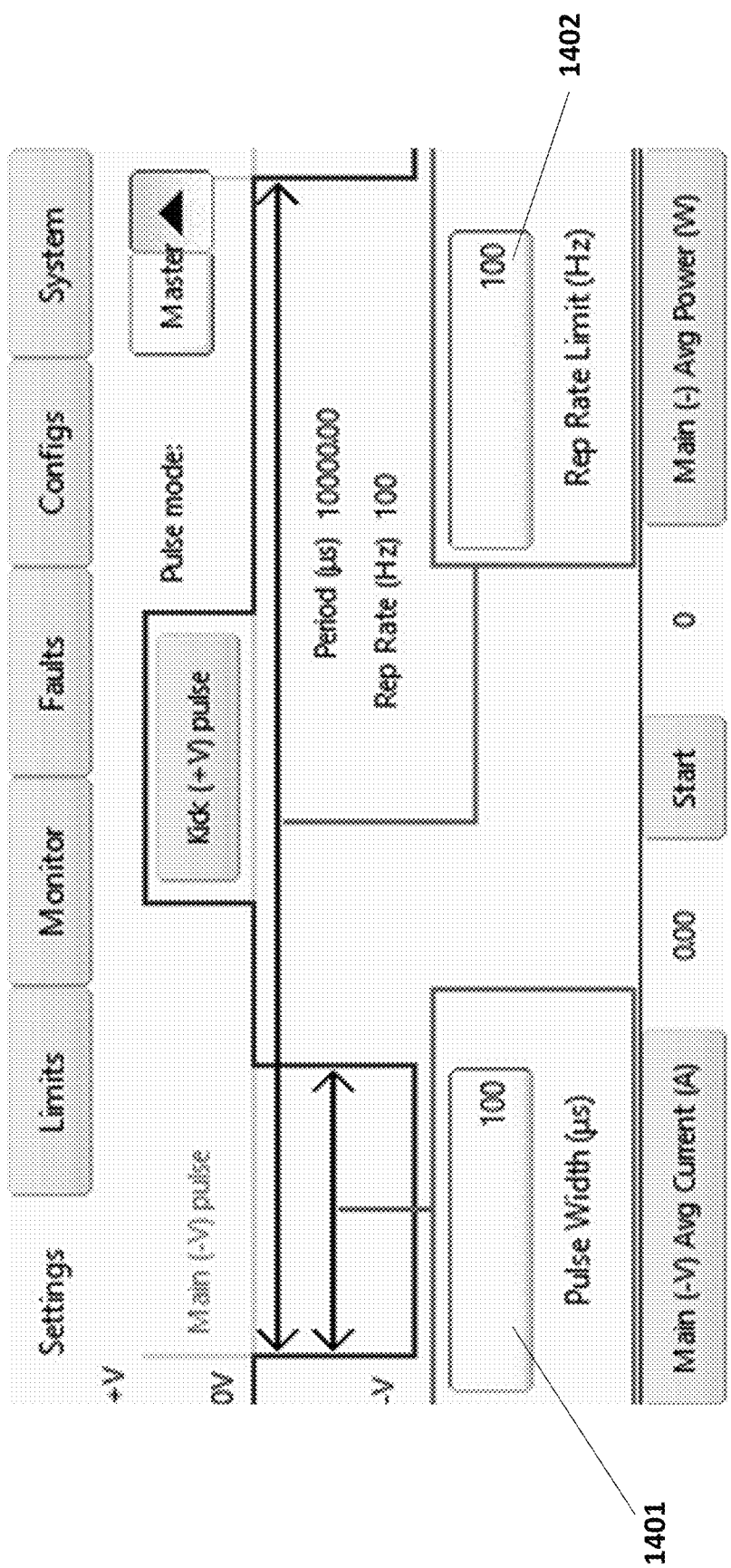
FIG. 14A is a graphic screenshot of the settings interface on the IMPULSE pulsed power module showing user-adjustable features and parameters including pulse width and repetition rate limit.
Figure 14B:
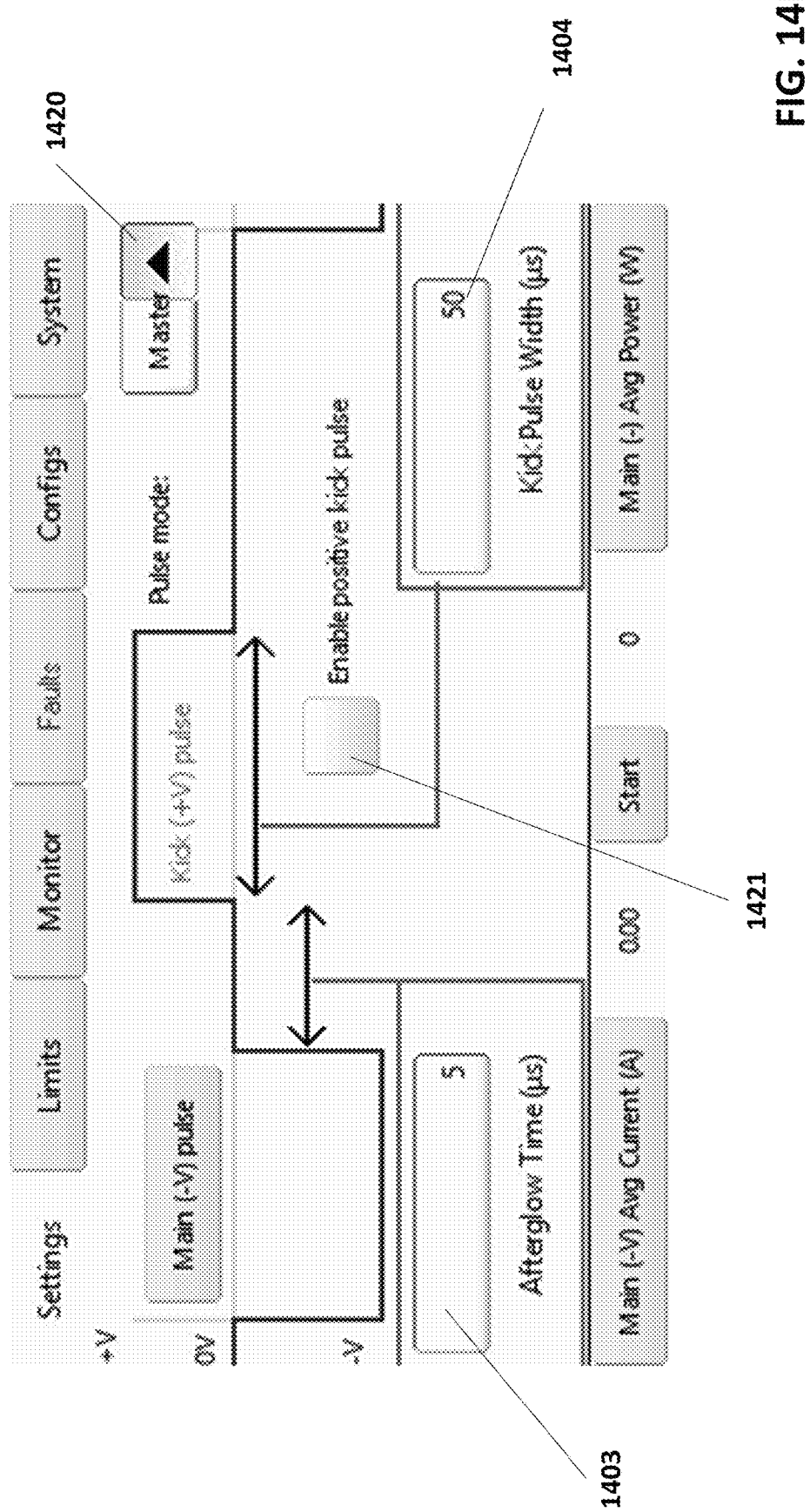
FIG. 14B is a graphic screenshot of the settings interface on the IMPULSE pulsed power module showing user-adjustable features and parameters including afterglow time, kick pulse enable, kick pulse width and master/slave mode control.
Figure 14C:
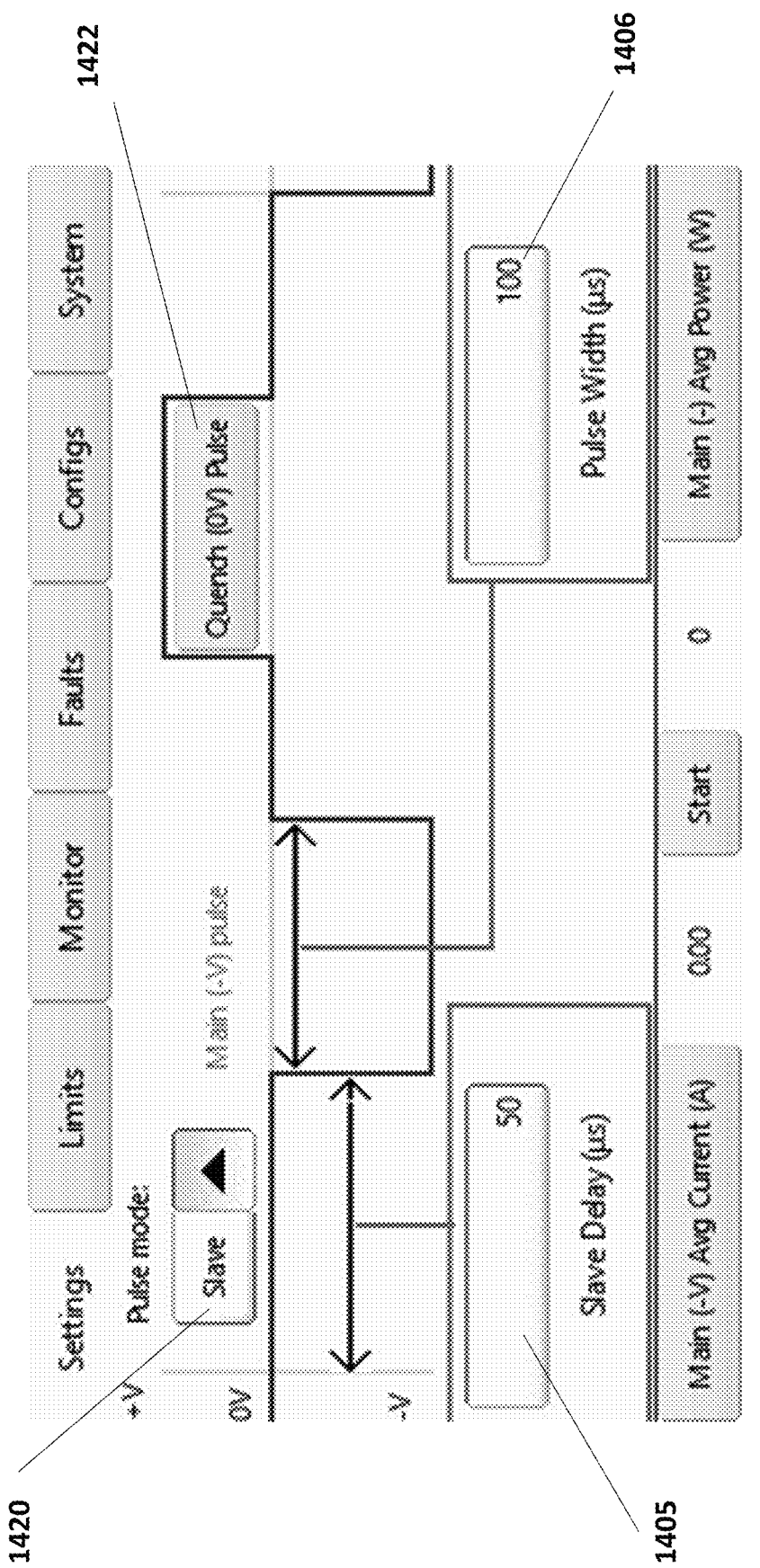
FIG. 14C is a graphic screenshot of the settings interface on the IMPULSE pulsed power module showing user-adjustable features and parameters including quench pulse setting, slave delay, slave pulse width, etc.
Figure 14D:
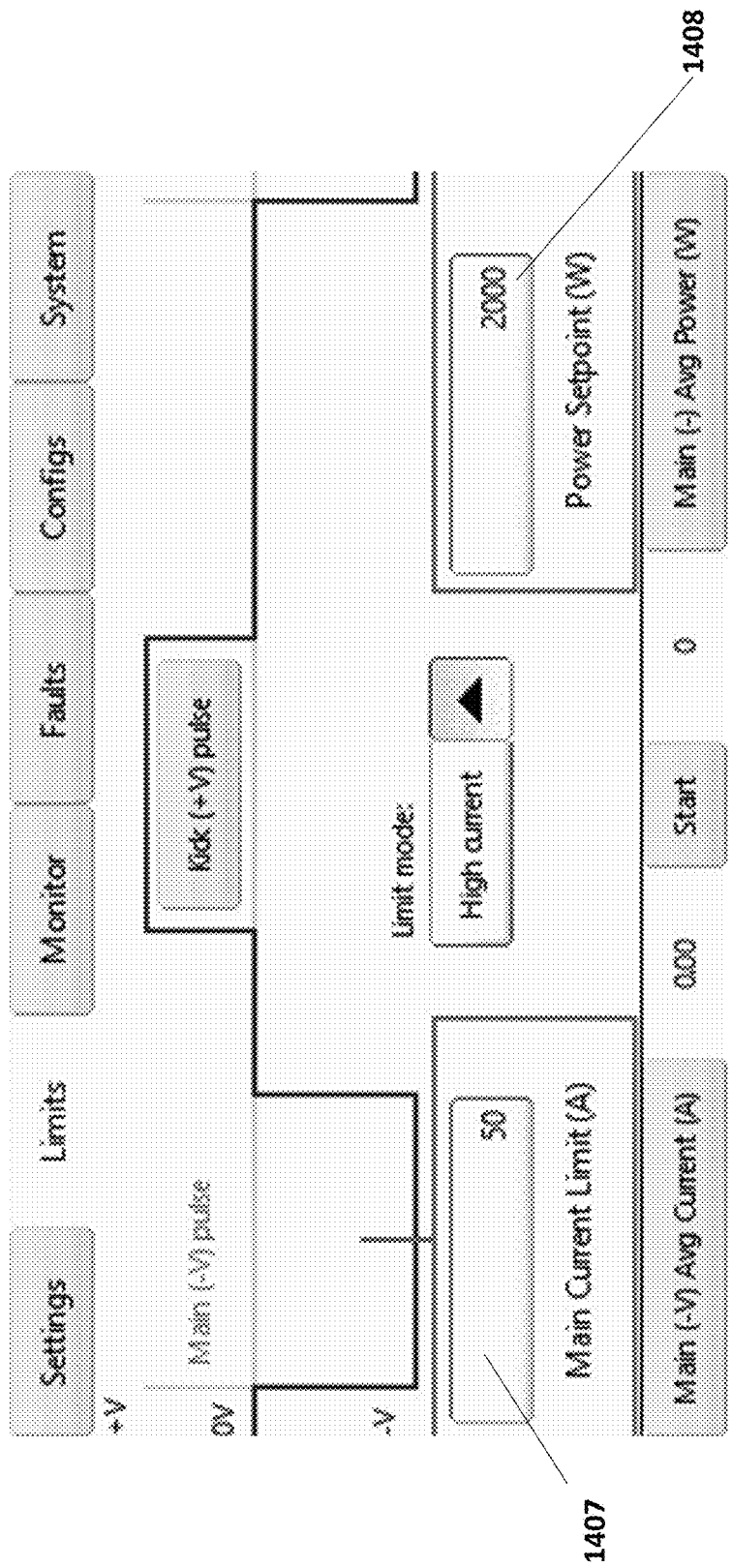
FIG. 14D is a graphic screenshot of the limits interface on the IMPULSE pulsed power module showing user-adjustable features and parameters including main current limit, average power control set point, high/low current mode and kick pulse voltage selection.
Figure 14E:
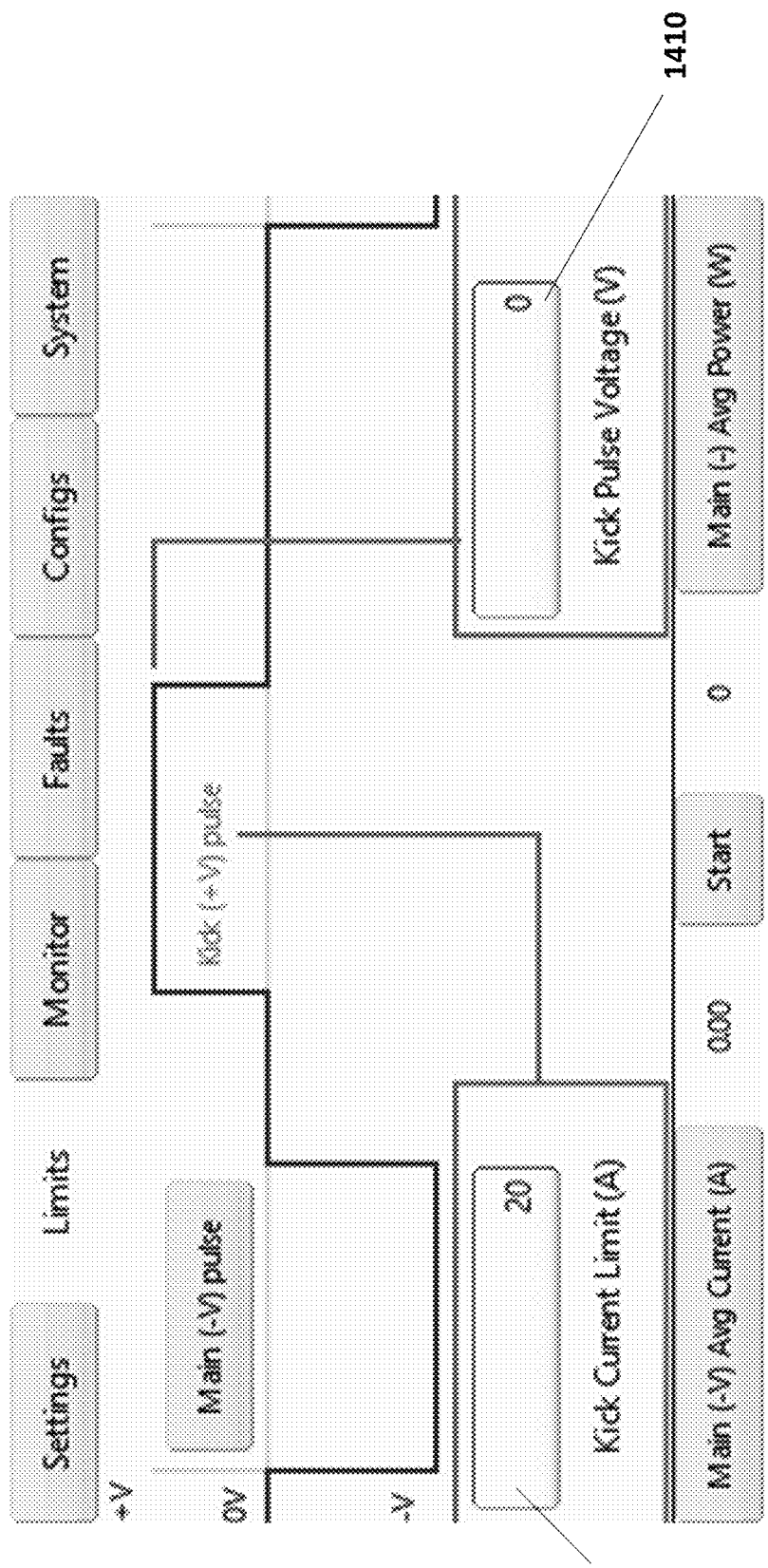
FIG. 14E is a graphic screenshot of the limits interface on the IMPULSE pulsed power module showing user-adjustable features and parameters including kick pulse current limit, kick pulse voltage selection, and monitoring displays.
Figure 14F:
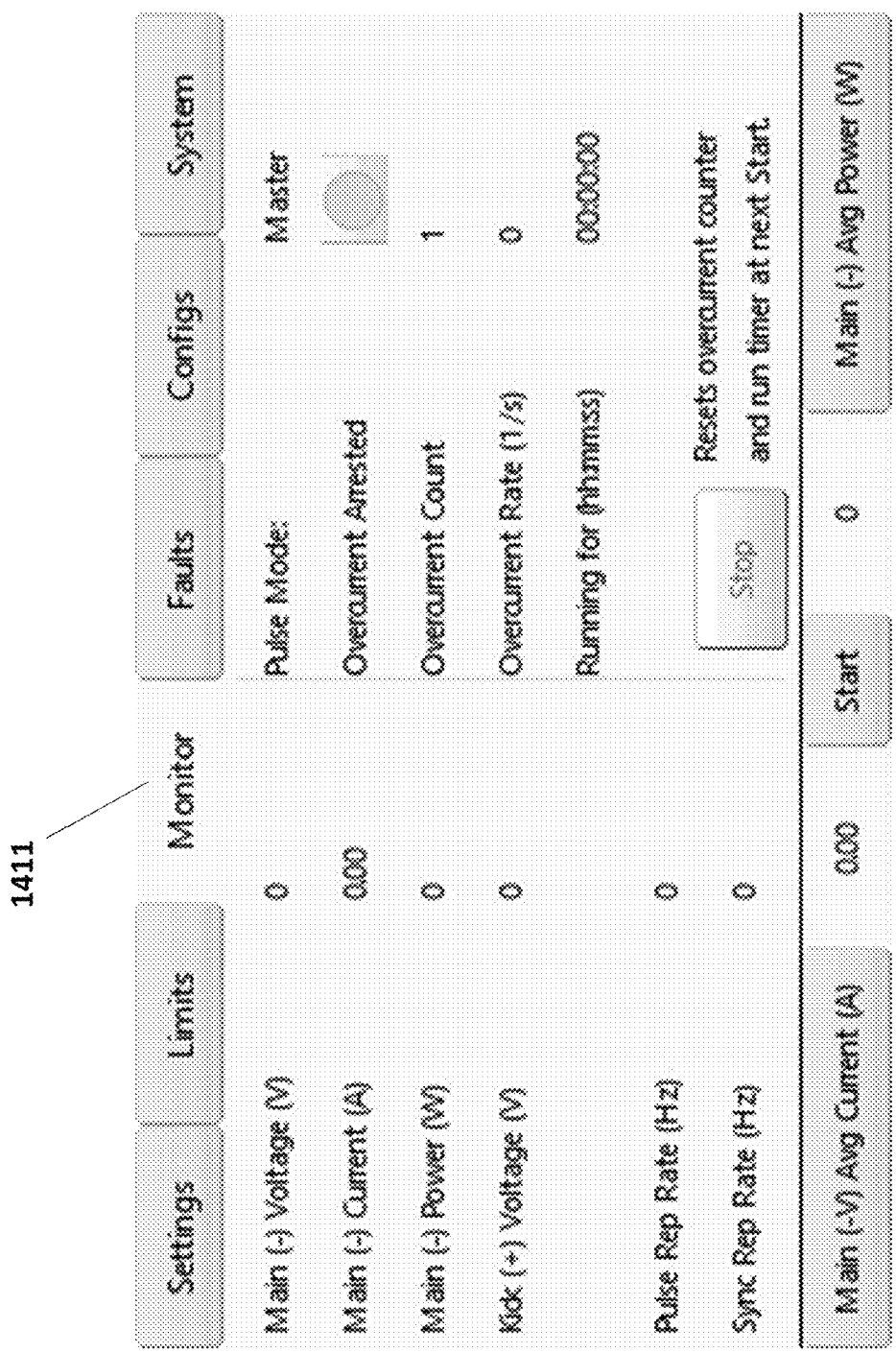
FIG. 14F is a graphic screenshot of the monitor interface on the IMPULSE pulsed power module showing monitored data for arc detect, overcurrent rate, current repetition rate, sync rate, etc.

The illustrative example of a system and operation methods described herein can also be used with an atmospheric-pressure plasma sputtering source using programmable positive kick pulses for ion energy to the substrate to improve film quality. FIG. 13 illustratively depicts an atmospheric-pressure plasma jet source 1300 with a sputtering rod target material 1302 through an insulating feed 1301 that is sourced with a main negative voltage pulse 1306 and a positive kick pulse voltage pulse 1307. Material 1304 sputtered off the sputtering target (electrode) material 1302 is entrained in a plasma flow 1303 onto the substrate for coating.

FIGS. 14A-F are a set of graphical user interfaces depicting configuration interfaces on an exemplary pulsed power module configuration user interface. The set of graphical user interface screens present a variety of user-adjustable features and parameters including: a main pulse width 1401, a repetition rate limit 1402, an afterglow time 1403 which is the delay before the onset of any kick pulse 1421 or grounding of the target to quench 1422 the plasma, a kick pulse width 1404, a setting for slave mode 1420 with a slave delay time 1405 that sets the delay for pulsing the slave system based on the master frequency, a slave pulse width 1406, a main negative pulse current limit 1407, an average power limit 1408 that works in conjunction with the repetition rate limit 1402 (either), a kick current limit 1409 and a kick pulse voltage 1410. A monitor screen 1411 allows the user to observe various sensed process variables including: overcurrent detection, arc limiter function, and general process values (e.g., current, voltage, etc.).

Figure 15:
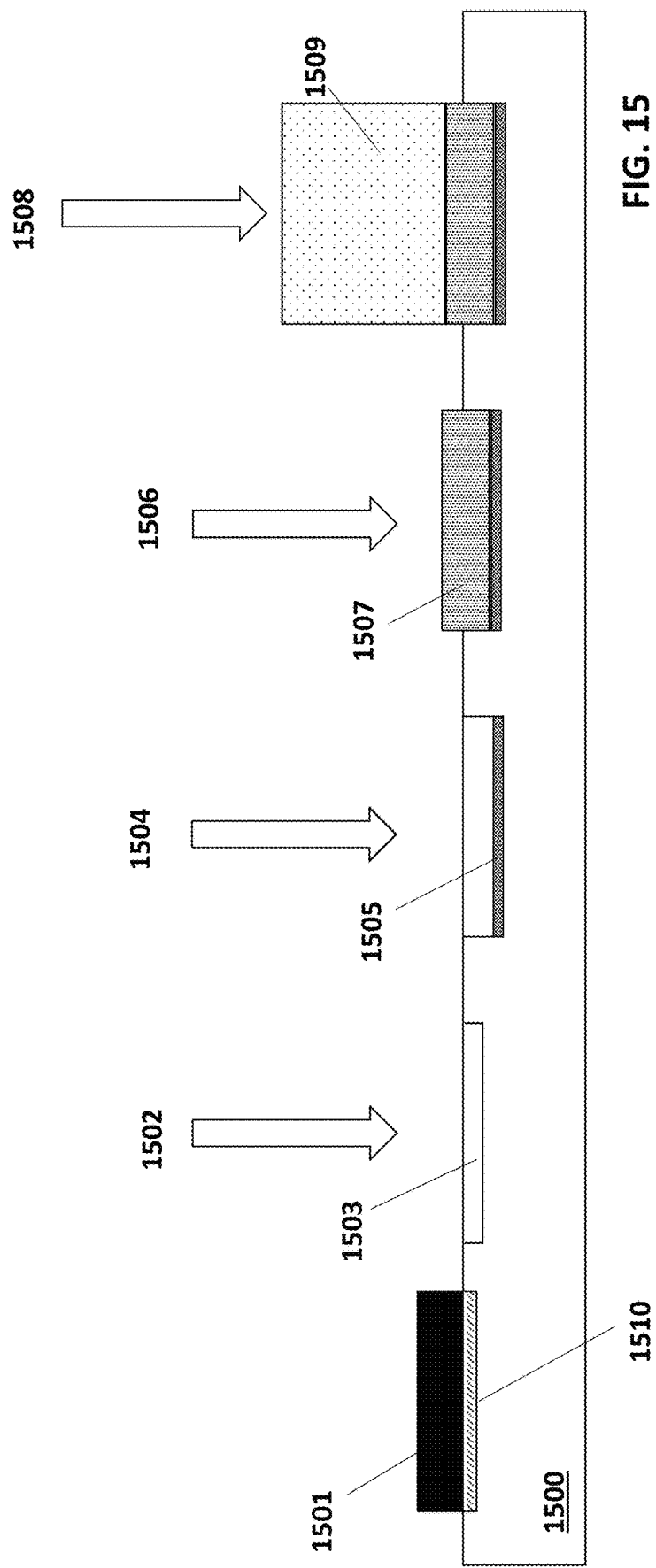
FIG. 15 illustratively depicts a sequence of stages for an exemplary method of removing surface contaminants, etching surface damage, generating an interface layer, generating a graded bond layer, and depositing the desired thin-film coating with optimized stress.

FIG. 15 illustratively depicts operation of a plasma system (including the power generating circuit/system depicted in FIG. 1 and a magnetron sputtering gun the positive kick pulse generating directed ion flux to perform a variety of distinct functions including to: pre-clean a substrate; etch away surface cracks, imperfections and machining stresses; establish a well-mixed interlayer between the substrate material and the thin-film layer; grade an adhesion layer for improved bonding to the substrate; control film stress and obtain desired film properties as the coating is applied. Initially, contaminants 1501 are present on the substrate surface 1500 that may also contain surface imperfections, cracks and residual stresses from prior machining 1510. The plasma deposition/etch mode of operation of the system depicted in FIG. 1 is activated, and the positive kick pulse is generated to be applied by the magnetron sputtering gun to generate an energetic ion flux towards the substrate. The positive kick pulse is set for high voltage (e.g. >+200V) and run with predominantly argon ions 1502 for etching of surface contaminants 1501 and surface imperfections 1510. This will generate a pristine etched surface layer region 1503.

Next, after a period, the plasma system is adjusted into hybrid deposition/etching mode 1504 with significant metal sputtering from the target (e.g. HiPIMS mode self-sputtering) at high kick potential for etching and ion implantation. A highly mixed interlayer 1505 is generated that transitions the substrate material to the thin-film material to be deposited (e.g. high-speed tool steel to TiAlN) for superior adhesion.

After a period, a next mode of operation of the system is established wherein the positive kick pulse voltage of the power generated by the system of FIG. 1 is decreased below the etching threshold 1506 and deposition is increased for rendering the bonding layer 1507. The ion energy flux is still high to allow material ordering and grading before transitioning to desired kick pulse and deposition conditions 1508 for the bulk thin-film 1509 properties desired. The latter condition is typically moderate kick energy, i.e. 50-100V.

It can thus be seen that a new and useful system for generating an electrical power pulse signal including a controlled opposite polarity kick pulse for enhancing operation of a sputtering system has been described. In view of the many possible embodiments to which the principles of the invention may be applied, it should be recognized that the examples described herein with respect to the drawing figures are meant to be illustrative only and should not be taken as limiting the scope of invention. For example, those of skill in the art will recognize that the elements of the illustrative examples depicted in functional blocks and depicted structures may be implemented in a wide variety of electronic circuitry and physical structures as would be understood by those skilled in the art. Thus, the illustrative examples may be modified in arrangement and detail without departing from the spirit of the invention. Therefore, the invention as described herein contemplates all such embodiments as may come within the scope of the following claims and equivalents thereof.

What is claimed is:

1. A method for generating and controlling ion flux in direct current high-power impulse magnetron sputtering (HiPIMS) comprising:

providing a vacuum apparatus containing a sputtering magnetron target electrode and a substrate to be treated;

generating a high-power pulsed plasma magnetron discharge with a high-current negative direct current (DC) pulse to the sputtering magnetron target electrode that:
  establishes a potential profile between the sputtering magnetron target electrode and the substrate, and
  generates a dense plasma zone located within a magnetic confinement region, where sputtered material from the sputtering magnetron target electrode is ionized and returned to a surface of the sputtering magnetron target electrode for re-sputtering; and generating, using a capacitive stored power source and a positive kick pulse power transistor, a configurable sustained positive voltage kick pulse that is provided to the sputtering magnetron target electrode after terminating the negative DC pulse;

wherein during the generating the configurable sustained positive voltage kick pulse, the configurable sustained positive voltage kick pulse reverses a potential across the magnetic confinement region and accelerates ions, including sputtered material of the sputtering magnetron target electrode, within the magnetic confinement region towards the substrate to be treated, and wherein during the generating the configurable sustained positive voltage kick pulse, program processor configured logic circuitry issues a control signal to the positive kick pulse power transistor to control a kick pulse property of the sustained positive voltage kick pulse taken from the group consisting of: onset delay, amplitude and duration.

2. The method of claim 1 wherein the generating the configurable sustained positive voltage kick pulse that is provided to the sputtering magnetron target electrode causes:
drawing electrons to the sputtering magnetron target electrode,
elevating a bulk plasma potential profile between the magnetic confinement region and the substrate to a positive potential, and
commuting the positive potential bulk plasma potential profile to a surface of the substrate.

3. The method of claim 2, wherein while generating the configurable sustained positive voltage kick pulse that is provided to the sputtering magnetron target electrode, the configurable sustained positive voltage kick pulse is sustained for a relatively short period to direct ions away from the magnetic confinement region adjacent to the magnetron target electrode.

4. The method of claim 2, wherein while generating the configurable sustained positive voltage kick pulse that is provided to the sputtering magnetron target electrode, the configurable sustained positive voltage kick pulse is sustained for a relatively long period sufficient to enhance ion flow at a substrate sheath.

5. The method of claim 1, wherein while generating the configurable sustained positive voltage kick pulse that is provided to the sputtering magnetron target electrode, the configurable sustained positive voltage kick pulse:
generates an electron backflow from the dense plasma zone to the magnetron target electrode; and
generates an ion flux return to an anode return electrode.

6. The method of claim 1 wherein the method comprises:
acquiring sensor readings indicative of average power generated on the magnetron target electrode; and
providing a power pulse adjustment based upon the acquired sensor readings and a power set point.

7. The method of claim 1 wherein the method comprises:
acquiring sensor readings indicative of the magnetron target electrode physical condition; and
providing an adjustment to the high-current negative DC pulse based upon sensor readings obtained during the acquiring.

8. The method of claim 1, wherein during the generating the configurable sustained positive voltage kick pulse, a waveform of the configurable sustained positive voltage kick pulse is adjusted to achieve a desired film property of a treated substrate surface, wherein the desired film property is taken from the group consisting of: stress, surface roughness, refractive index, crystallinity, grain size, hardness, density, porosity, sp3/sp2 ratio, high-aspect ratio coverage, adhesion, doping, porosity.

9. The method of claim 1, wherein during the generating, the configurable sustained positive voltage kick pulse waveform is adjusted to perform a selective etching on the substrate to be treated by generating ions that are above a first sputtering threshold for a first substrate material and below a second sputtering threshold of a second substrate material, wherein the generating is being performed during an etching and deposition process on the substrate.

10. The method of claim 1, wherein during the generating, the configurable sustained positive voltage kick pulse waveform is adjusted over a course of time for carrying out a multistage process on the substrate to be treated by:
first adjusting the waveform to achieve a surface cleaning on the substrate,
second adjusting the waveform to etch away a surface layer of the substrate having imperfections, and
third adjusting the waveform to deposit a bonded interface.

* * * * *